US010008575B2

(12) United States Patent
Suh et al.

(10) Patent No.: US 10,008,575 B2
(45) Date of Patent: Jun. 26, 2018

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Dong Chan Suh, Suwon-si (KR); Yong Suk Tak, Seoul (KR); Gi Gwan Park, Hwaseong-si (KR); Mi Seon Park, Daegu (KR); Moon Seung Yang, Hwaseong-si (KR); Seung Hun Lee, Hwaseong-si (KR); Poren Tang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/298,746

(22) Filed: Oct. 20, 2016

(65) Prior Publication Data
US 2017/0222006 A1    Aug. 3, 2017

(30) Foreign Application Priority Data

Jan. 28, 2016    (KR) .................. 10-2016-0010528

(51) Int. Cl.
*H01L 29/423*    (2006.01)
*H01L 29/08*    (2006.01)
(Continued)

(52) U.S. Cl.
CPC .... *H01L 29/42376* (2013.01); *H01L 23/5283* (2013.01); *H01L 29/0847* (2013.01);
(Continued)

(58) Field of Classification Search
CPC ......... H01L 23/5283; H01L 29/42376; H01L 29/42364; H01L 29/42324; H01L 29/4234;
(Continued)

(56) References Cited

U.S. PATENT DOCUMENTS 7,074,657 B2    7/2006 Pan et al.
7,229,884 B2    6/2007 Park
(Continued)

FOREIGN PATENT DOCUMENTS

KR    10-0369341 B1    1/2003
KR    10-0558038 B1    3/2006

*Primary Examiner* — Cheung Lee
*Assistant Examiner* — Stephen C Smith
(74) *Attorney, Agent, or Firm* — Harness, Dickey, & Pierce, P.L.C.

(57) ABSTRACT

A semiconductor device includes at least a first wire pattern, a gate electrode, a semiconductor pattern, a gate insulating layer, and a first spacer. The first wire pattern is on a substrate and isolated from the substrate. The gate electrode surrounds and intersects the first wire pattern. The semiconductor pattern is on both sides of the first wire pattern, and the semiconductor pattern includes a portion which overlaps the first wire pattern. The gate insulating layer is disposed between the gate electrode and the first wire pattern, and the gate insulating layer surrounds the first wire pattern. The first spacer is between the first wire pattern and the substrate, and the first spacer is between the gate insulating layer and the semiconductor pattern.

20 Claims, 35 Drawing Sheets

(51) Int. Cl.
*H01L 29/66* (2006.01)
*H01L 29/78* (2006.01)
*H01L 23/528* (2006.01)
*H01L 29/06* (2006.01)

(52) U.S. Cl.
CPC .. *H01L 29/42364* (2013.01); *H01L 29/66439* (2013.01); *H01L 29/7831* (2013.01); *H01L 29/0673* (2013.01)

(58) Field of Classification Search
CPC ............ H01L 29/7831; H01L 29/0847; H01L 29/0673
See application file for complete search history.

(56) References Cited

U.S. PATENT DOCUMENTS

| | | | |
|---|---|---|---|
| 7,316,968 B2 | 1/2008 | Lee et al. | |
| 7,723,238 B2 | 5/2010 | Chiba | |
| 8,129,777 B2 | 3/2012 | Kim et al. | |
| 8,288,823 B2 | 10/2012 | Ernst et al. | |
| 8,492,232 B2 | 7/2013 | Ernst et al. | |
| 8,994,081 B2* | 3/2015 | Leobandung | H01L 29/78609 257/18 |
| 2007/0200178 A1* | 8/2007 | Yun | H01L 29/42392 257/353 |
| 2014/0183452 A1 | 7/2014 | Hirai et al. | |
| 2014/0239255 A1 | 8/2014 | Kang et al. | |
| 2014/0273292 A1 | 9/2014 | Posseme et al. | |
| 2014/0339507 A1* | 11/2014 | Leobandung | H01L 29/78609 257/29 |
| 2015/0084041 A1* | 3/2015 | Hur | H01L 29/7832 257/43 |
| 2015/0104918 A1 | 4/2015 | Liu et al. | |
| 2015/0123215 A1 | 5/2015 | Obradovic et al. | |
| 2015/0236120 A1 | 8/2015 | Hashemi et al. | |
| 2015/0255594 A1 | 9/2015 | Zhu et al. | |
| 2015/0295084 A1* | 10/2015 | Obradovic | H01L 29/7845 257/347 |

* cited by examiner

US 10,008,575 B2

SEMICONDUCTOR DEVICE AND METHOD OF FABRICATING THE SAME

This application claims priority to Korean Patent Application No. 10-2016-0010528 filed on Jan. 28, 2016 in the Korean Intellectual Property Office (KIPO), the disclosure of which is incorporated herein in its entirety by reference.

BACKGROUND

1. Technical Field

The present disclosure relates to semiconductor devices and methods of fabricating the same.

2. Description of the Related Art

A multi-gate-transistor, multi-bridge-channel nanosheet device, in which a nanowire silicon body is formed on a substrate and a gate is formed to surround the silicon body, has been suggested as a scaling technique for increasing the density of a semiconductor device.

SUMMARY

According to example embodiments, multi-gate-transistor, multi-bridge-channel nanosheet devices use a three-dimensional (3D) channel, and as such may be scaled. The multi-gate-transistor, multi-bridge-channel nanosheet devices of the example embodiments are also effective in (i) enhancing current control capability without the need to increase the gate length of a multi-gate transistor, and (ii) suppressing or reducing a Short Channel Effect (SCE), i.e., the influence of a drain voltage on the electric potential of a channel region.

According to an example embodiment, a semiconductor device comprises a first wire pattern on a substrate, the first wire pattern isolated from the substrate, a gate electrode surrounding and intersecting the first wire pattern, a semiconductor pattern on both sides of the first wire pattern, the semiconductor pattern includes a first part which overlaps the first wire pattern, a gate insulating layer between the gate electrode and the first wire pattern, and the gate insulating layer surrounding the first wire pattern and a first spacer between the first wire pattern and the substrate, and the first spacer between the gate insulating layer and the semiconductor pattern.

According to an example embodiment, a semiconductor device comprises a first wire pattern on a substrate, the first wire pattern isolated from the substrate, a gate electrode surrounding and intersecting the first wire pattern, a semiconductor pattern on at least two sides of the first wire pattern, a gate insulating layer between the gate electrode and the first wire pattern, and the gate insulating layer surrounding the first wire pattern; and a first spacer between the first wire pattern and the substrate, and the first spacer between the gate insulating layer and the semiconductor pattern, the first spacer including first and second sidewalls which extend from the first wire pattern with respect to the substrate, wherein at least one of the first and second sidewalls is convex with respect to the gate electrode.

According to an example embodiment, a semiconductor device includes a wire pattern on a substrate, the wire pattern isolated from the substrate, a gate electrode surrounding and intersecting the wire pattern, a semiconductor pattern on first and second sides of the wire pattern, a gate insulating layer between the gate electrode and the wire pattern and a spacer on the second side of the wire pattern, the spacer between the semiconductor pattern and the gate insulating layer

DETAILED DESCRIPTION OF EXAMPLE EMBODIMENTS

Inventive concepts will now be described more fully hereinafter with reference to the accompanying drawings, in which example embodiments of inventive concepts are shown. Inventive concepts may, however, be embodied in different forms and should not be construed as limited to example embodiments set forth herein. Rather, example embodiments are provided so that this disclosure will be thorough and complete, and will fully convey the scope of inventive concepts to those skilled in the art. The same reference numbers indicate the same components throughout the specification. In the attached figures, the thickness of layers and regions is exaggerated for clarity.

For convenience, an interlayer dielectric layer is not illustrated in the accompanying drawings.

A semiconductor device according to some example embodiments will hereinafter be described with reference to FIGS. 1 through 6.

Figure 1:
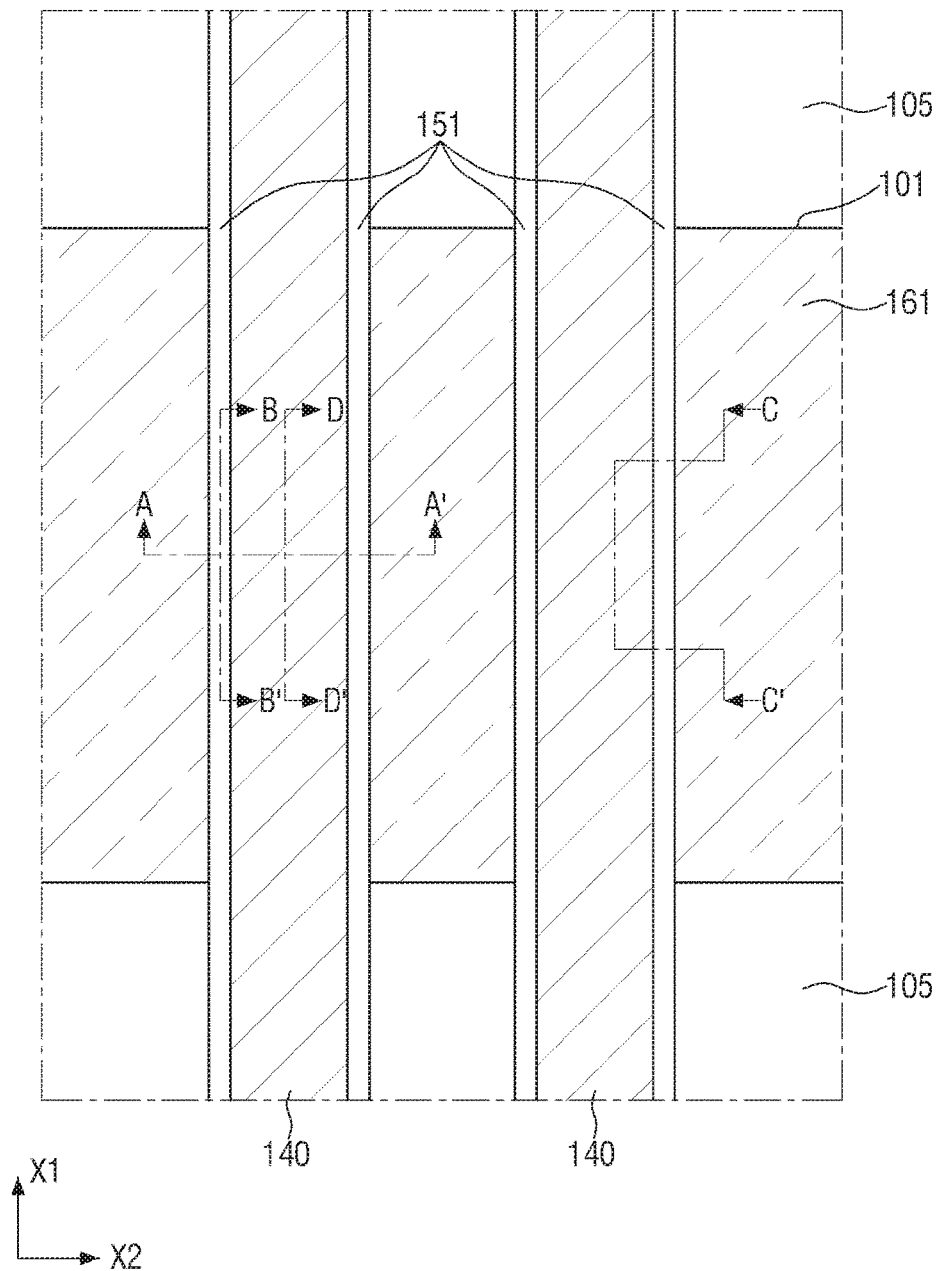
FIG. 1 is a top view of a semiconductor device according to some example embodiments.
Figure 2:
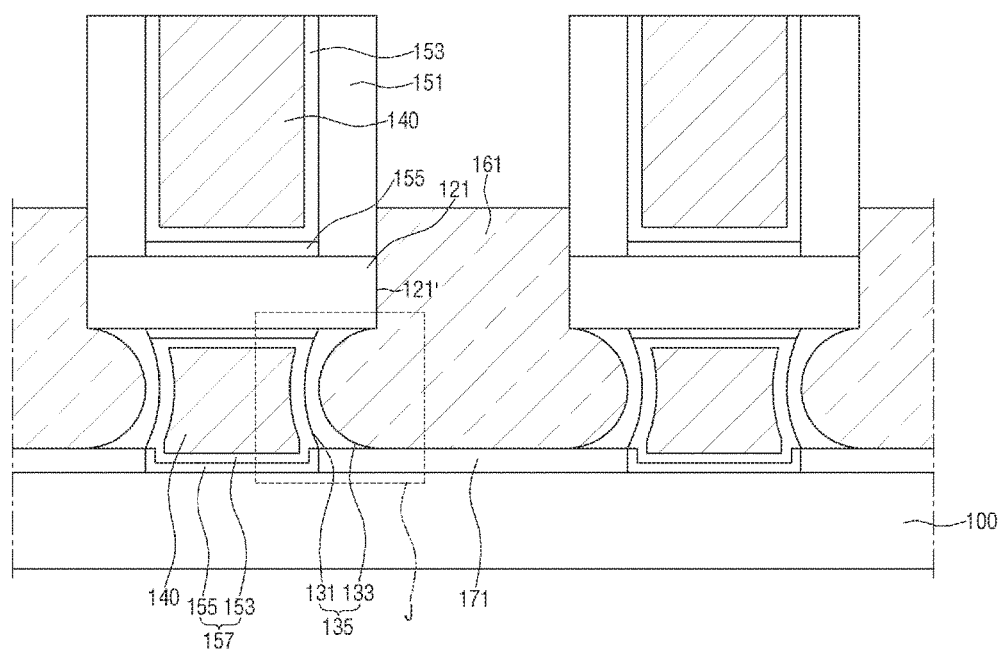
FIG. 2 is an example cross-sectional view taken along line A-A' of FIG. 1.
Figure 3:
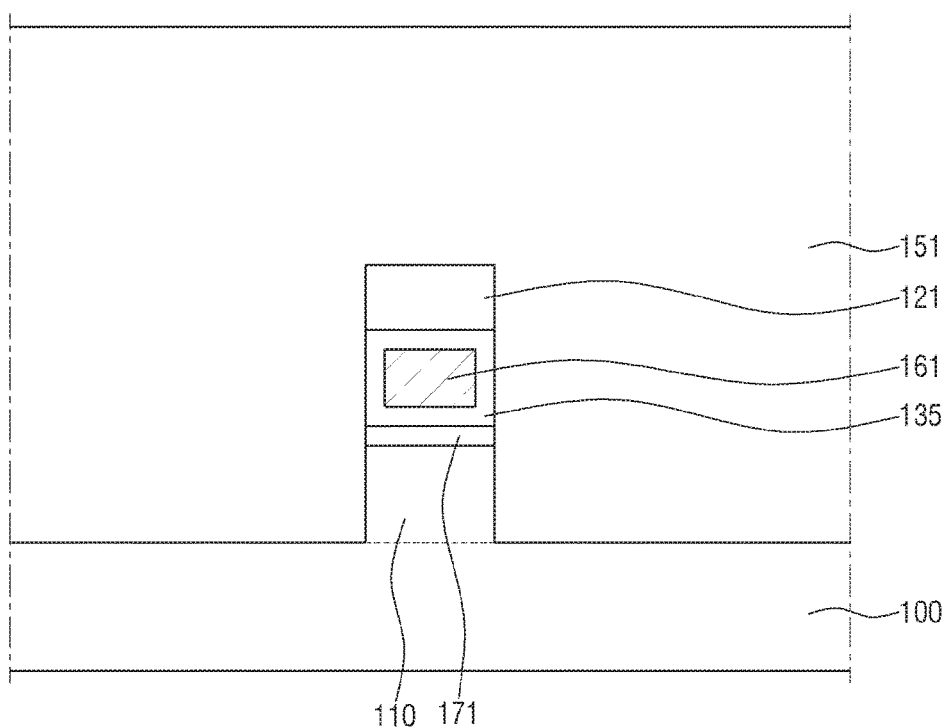
FIG. 3 is an example cross-sectional view taken along line B-B' of FIG. 1.
Figure 4:
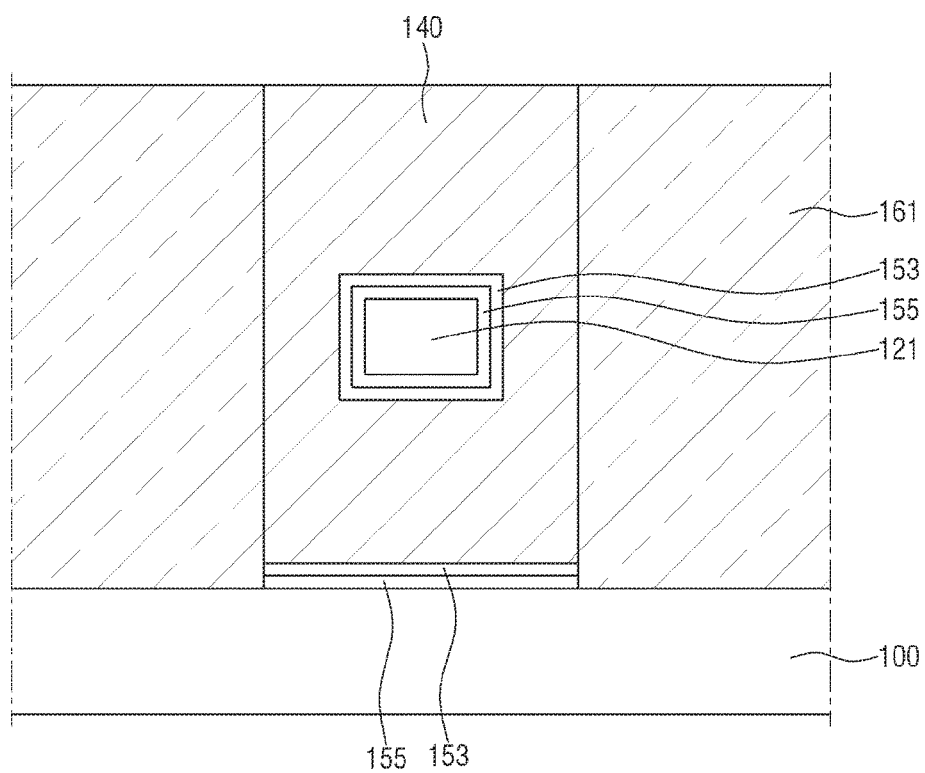
FIG. 4 is an example cross-sectional view taken along line C-C' of FIG. 1.
Figure 5:
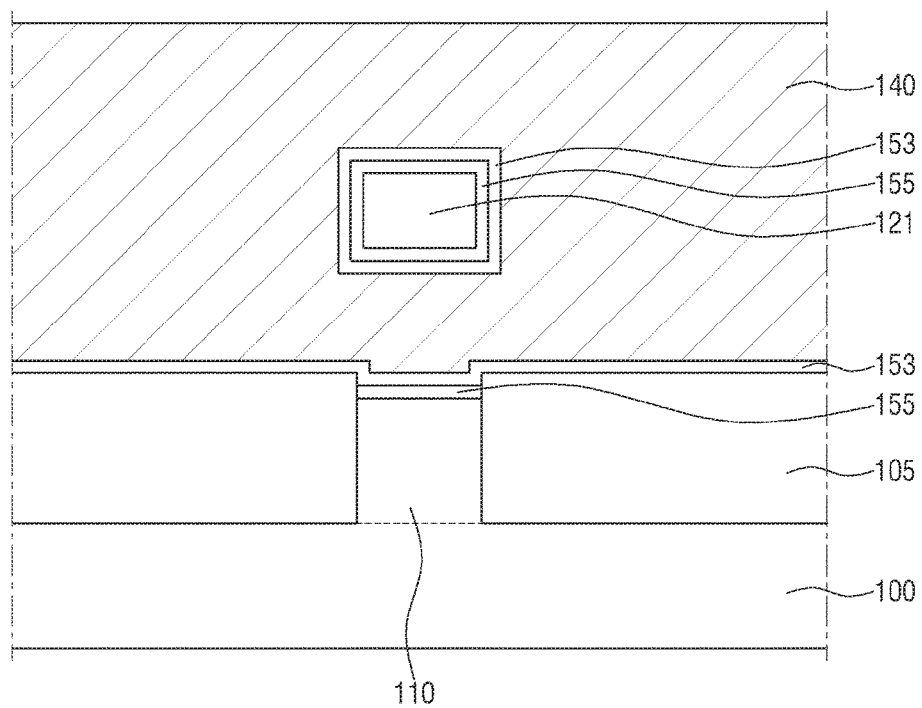
FIG. 5 is an example cross-sectional view taken along line D-D' of FIG. 1.
Figure 6:
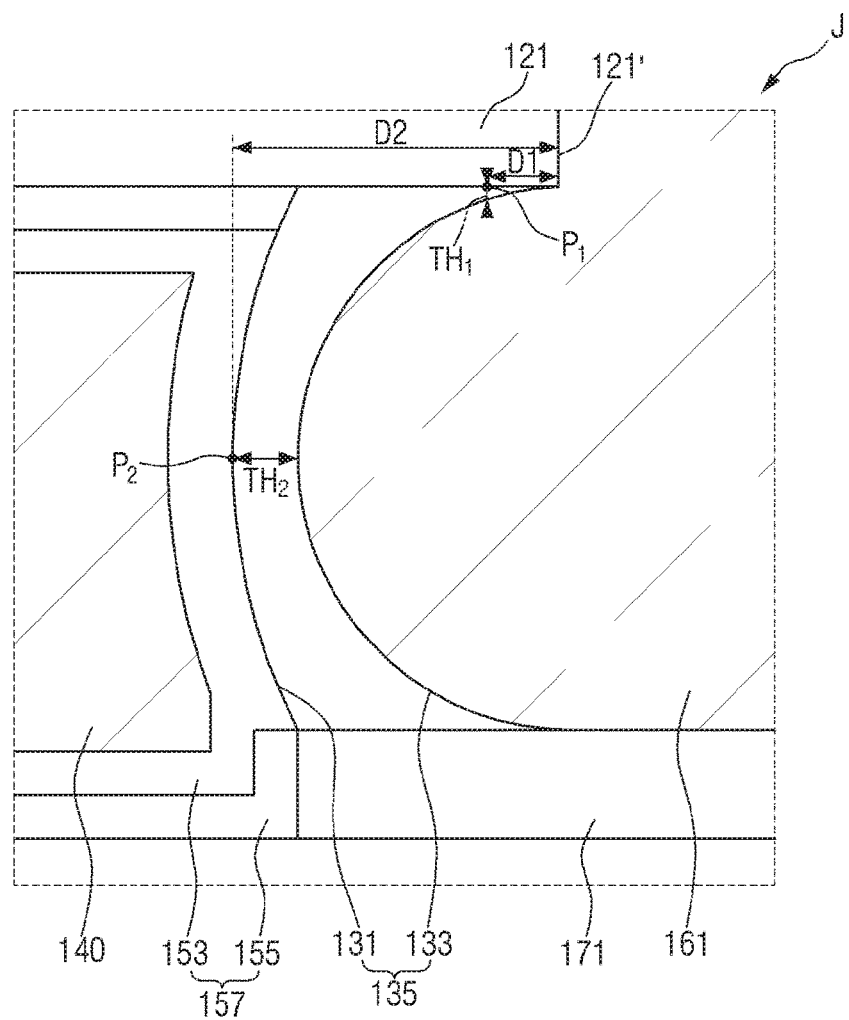
FIG. 6 is an enlarged view of an area J of FIG. 2.

FIG. 1 is a top view of a semiconductor device according to some example embodiments. FIG. 2 is an example cross-sectional view taken along line A-A' of FIG. 1. FIG. 3 is an example cross-sectional view taken along line B-B' of FIG. 1. FIG. 4 is an example cross-sectional view taken along line C-C' of FIG. 1. FIG. 5 is an example cross-sectional view taken along line D-D' of FIG. 1. FIG. 6 is an enlarged view of an area J of FIG. 2.

Referring to FIGS. 1 to 6, the semiconductor device according to the present example embodiment may include, in an active region 101, a semiconductor pattern 161, a gate electrode 140, and a gate spacer 151.

For example, a substrate 100 may be a bulk silicon (Si) substrate or a Silicon-On-Insulator (SOI) substrate. Alternatively, the substrate 100 may be a Si substrate, or may comprise another material such as, for example, silicon germanium (SiGe), indium antimonide (InSb), lead telluride (PbTe), indium arsenide (InAs), indium phosphide (InP), gallium arsenide (GaAs), or gallium antimonide (GaSb). Alternatively, the substrate 100 may include an epitaxial layer formed on a base substrate.

A fin-type pattern 110, shown in FIG. 3, may protrude from the substrate 100. A field insulating layer 105 may at least partially surround the sidewall of the fin-type pattern 110. The fin-type pattern 110 may be defined by the field insulating layer 105. For example, the field insulating layer 105 may include one of an oxide layer, a nitride layer, an oxynitride layer, and a combination thereof.

FIG. 5 illustrates the sidewall of the fin-type pattern 110 as being surrounded by the field insulating layer 105, but the present disclosure is not limited thereto. The top surface of the field insulating layer 105 is illustrated as protruding beyond the top surface of the fin-type pattern 110, but the present disclosure is not limited thereto. For example, the height from the substrate 100 to the top surface of the field insulating layer 105 may be the same as the height from the substrate 100 to the top surface of the fin-type pattern 110.

The fin-type pattern 110 may extend long in a second direction X2. That is, for example, the fin-type pattern 110 may have long sides that extend in the second direction X2 and short sides that extend in a first direction X1.

The fin-type pattern 110 may be formed by etching part of the substrate 100 or may include an epitaxial layer, which is grown from the substrate 100. The fin-type pattern 110 may comprise an element semiconductor material such as, for example, silicon (Si) or germanium (Ge). The fin-type pattern 110 may also comprise a compound semiconductor such as, for example, a IV-IV group compound semiconductor or a III-V group compound semiconductor.

For example, the fin-type pattern 110 may comprise a IV-IV compound semiconductor such as a binary or ternary compound consisting of at least two of carbon (C), Si, Ge, and tin (Sn) or a compound obtained by doping the binary or ternary compound with an IV group element.

For example, the fin-type pattern 110 may comprise a III-V group compound semiconductor such as a binary, ternary, or quaternary compound obtained by combining at least one III-group element selected from among aluminum (Al), gallium (Ga), and indium (In) and one V-group element selected from among phosphorous (P), arsenic (As), and antimony (Sb).

In the following description, it is assumed that the fin-type pattern 110 comprises Si.

The field insulating layer 105 may be formed not to overlap the active region 101, but the present disclosure is not limited thereto. For example, the field insulating layer 105 may include at least one of a silicon oxide layer, a silicon nitride layer, and a silicon oxynitride layer.

Still referring to FIG. 5, an interlayer dielectric layer may be formed on the gate electrode 140. For example, the interlayer dielectric layer may include at least one of a low-dielectric constant material, an oxide layer, a nitride layer, and an oxynitride layer. For example, the low-dielectric constant material may be Flowable Oxide (FOX), Tonen Sila7en (TOSZ), Undoped Silica Glass (USG), BoroSilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable Chemical Vapor Deposition (FCVD) oxide, or a combination thereof.

A first sacrificial pattern 171, as shown in FIG. 6, may be formed on the substrate 100 to extend in the same direction as the gate electrode 140. The first sacrificial pattern 171 may be formed on part of the substrate 100 where the gate electrode 140 is not formed. The first sacrificial pattern 171 may also be formed in an area of vertical overlap with the semiconductor pattern 161. The first sacrificial pattern 171 may also be formed between the substrate 100 and the semiconductor pattern 161. The first sacrificial pattern 171 may protrude from the top surface of the substrate 100.

Referring to FIG. 3, the first sacrificial pattern 171 may also be formed on the top surface of the fin-type pattern 110. The first sacrificial pattern 171 may be formed to be placed in contact with at least part of a first spacer 135. That is, the first spacer 135 may be formed on the first sacrificial pattern 171. In other words, at least part of the first sacrificial pattern 171 may be disposed between the substrate 100 and the first spacer 135.

The first sacrificial pattern 171 may comprise SiGe, but the present disclosure is not limited thereto. That is, the first sacrificial pattern 171 may comprise a different material from a first wire pattern 121.

The first wire pattern 121, as shown in FIG. 3, may be formed on the substrate 100 to be isolated from the substrate 100. The first wire pattern 121 may extend in the second direction X2, but the present disclosure is not limited thereto. That is, the first wire pattern 121 may extend in a different direction from the gate electrode 140. The first wire pattern 121 may extend to penetrate the gate electrode 140.

In some example embodiments, the first wire pattern 121 does not extend into the semiconductor pattern 161, but the present disclosure is not limited thereto. For example, the first wire pattern 121 may extend into the semiconductor pattern 161 and may thus be surrounded by the semiconductor pattern 161.

As shown in FIG. 2, the length of the first wire pattern 121 is illustrated as being the same as the length from one side of the gate spacer 151 to the other side of the gate spacer 151, but the present disclosure is not limited thereto. For example, the first wire pattern 121 may be formed to protrude beyond the gate spacer 151.

The first wire pattern 121 may include a first wire pattern end 121'. The first wire pattern end 121', for example, may be placed in contact with the semiconductor pattern 161.

The semiconductor device according to the present example embodiment is illustrated as having one wire pattern 121, but the present disclosure is not limited thereto. That is, the semiconductor device according to the present example embodiment may have one or more wire patterns, in which case, the wire patterns may be isolated from each other, as will be discussed later.

Referring now to FIG. 4, the first wire pattern 121 has a rectangular cross-sectional shape, but the present disclosure is not limited thereto. That is, the edges of the first wire pattern 121 may be rounded by trimming, for example.

The first wire pattern 121 may comprise Si, but the present disclosure is not limited thereto. For example, the first wire pattern 121 may comprise a different material from the first sacrificial pattern 171.

The first wire pattern 121 may be used as the channel region of a transistor.

Figure 7:
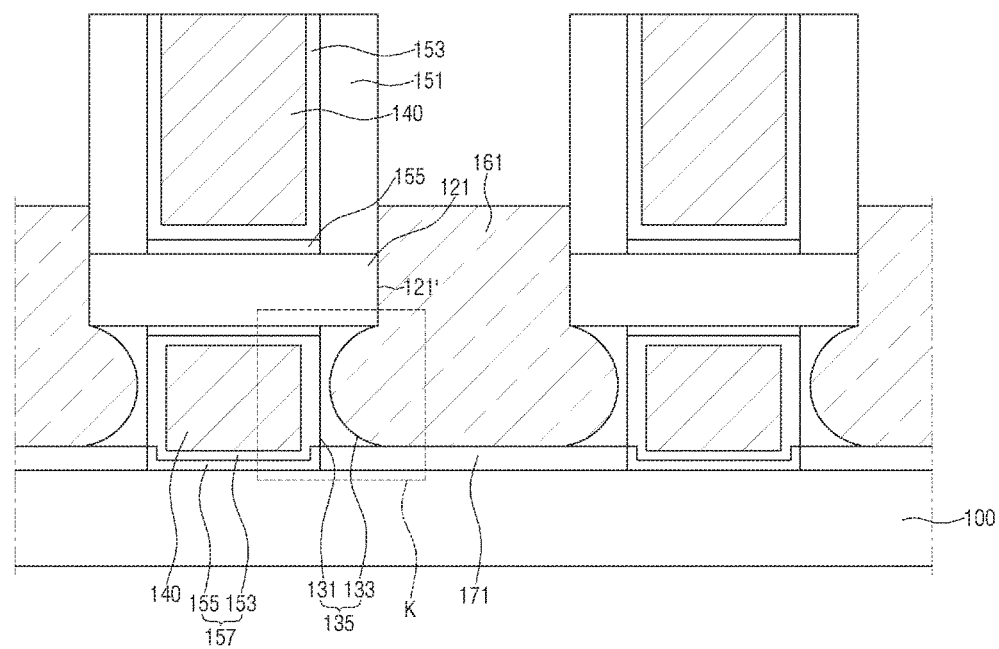
FIG. 7 is an example cross-sectional view taken along line A-A' of FIG. 1.

The semiconductor pattern 161 may be disposed on both sides of the first wire pattern 121. The semiconductor pattern 161 may have a portion that vertically overlaps the first wire pattern 121. For example, the portion of the semiconductor pattern 161 that vertically overlaps the first wire pattern 121 may be recessed toward the gate electrode 140 between the substrate 100 and the first wire pattern 121, as shown in FIG. 7, for example. [57] In some example embodiments, the semiconductor pattern 161 may be placed in contact with the first sacrificial pattern 171, which is disposed between the substrate 100 and the semiconductor pattern 161, but the present disclosure is not limited thereto. That is, as will be discussed later with reference to FIGS. 15 and 16, the semiconductor pattern 161 may be placed in contact with only part of the first sacrificial pattern 171.

The semiconductor pattern 161 is illustrated as being formed to extend below the top surface of the gate electrode 140, but the present disclosure is not limited thereto. For example, the semiconductor pattern 161 may be formed to be higher than the first wire pattern 121, which may be used as a channel region.

Referring back to FIG. 3, the semiconductor pattern 161 is illustrated as having a rectangular cross-sectional shape, but the present disclosure is not limited thereto. The semiconductor pattern 161 may have, for example, various cross-sectional shapes other than a rectangular cross-sectional shape, such as a hexagonal cross-sectional shape, depending on the degree of epitaxial growth thereof.

According to an example embodiment, the semiconductor pattern 161 may be used as a source/drain region of a transistor. If the transistor is a P-channel Metal Oxide Semiconductor (PMOS) transistor, the semiconductor pattern 161 may comprise a compressive stress material. The compressive stress material may be, for example, a material having a larger lattice constant than Si, such as SiGe. The compressive stress material may improve the mobility of carriers in a channel region by applying compressive stress to the first wire pattern 121.

If the transistor is an N-channel Metal Oxide Semiconductor (NMOS) transistor, the semiconductor pattern 161 may comprise the same material as the substrate 100 or a tensile stress material. For example, if the substrate 100 comprises Si, the semiconductor pattern 161 may also comprise Si, or alternatively may comprise a material having a smaller lattice constant than Si (for example, SiC).

Referring back to FIG. 2, the gate electrode 140 may be formed on the substrate 100, and extend in a direction that intersects the first wire pattern 121. For example, the gate electrode 140 may extend in the first direction X1 over the substrate 100. The first and second directions X1 and X2 are illustrated as crossing each other at right angles, but the present disclosure is not limited thereto. That is, for example, the gate electrode 140 may be formed in a different direction from the first wire pattern 121.

The gate electrode 140 may be formed to surround the first wire pattern 121. That is, as shown in FIG. 2, the gate electrode 140 may also be formed in the gap between the first wire pattern 121 and the substrate 100.

The gate electrode 140 may comprise a conductive material. The gate electrode 140 is illustrated as being a single layer, but the present disclosure is not limited thereto. That is, the gate electrode 140 may include a work function conductive layer for adjusting a work function and a filling conductive layer for filling the space formed by the work function conductive layer.

The gate electrode 140 may comprise, for example, at least one of TiN, WN, TaN, Ru, TiC, TaC, Ti, Ag, Al, TiAl, TiAlN, TiAlC, TaCN, TaSiN, Mn, Zr, W, and Al. In another example embodiment, the gate electrode 140 may comprise Si or SiGe, rather than a metal. That is, for example, the gate electrode 140 may be formed by replacement, but the present disclosure is not limited thereto.

As shown in FIG. 2, a gate insulating layer 157 may be formed between the gate electrode 140 and the first wire pattern 121. The gate insulating layer 157 may also be formed between the substrate 100 and the gate electrode 140. The gate insulating layer 157 may also be formed between the first spacer 135 and the gate electrode 140.

The gate insulating layer 157 may be formed to surround the first wire pattern 121. That is, the gate insulating layer 157 may be formed along the circumference of the first wire pattern 121. The gate insulating layer 157 may also be formed along the top surface of the substrate 100. The gate insulating layer 157 may also be formed along the sidewall of the gate spacer 151. That is, the gate insulating layer 157 may be formed along the sidewall of the gate spacer 151 and the sidewall of the first spacer 135.

The gate insulating layer 157 may comprise, for example, a high-dielectric constant insulating layer 153 and an interface layer 155, but the present disclosure is not limited thereto. For example, the interface layer 155 of the gate insulating layer 157 may not be provided depending on the material of the first wire pattern 121.

The interface layer 155 may be formed to surround the first wire pattern 121. That is, the interface layer 155 may be formed along the circumference of the first wire pattern 121. The interface layer 155 may also be formed between the substrate 100 and the gate electrode 140. The interface layer 155 may also be formed on the fin-type pattern 110. The interface layer 155 may also be formed between the first sacrificial pattern 171 and the gate electrode 140.

Still referring to FIG. 2, the high-dielectric constant insulating layer 153 of the gate insulating layer 157 may be formed to surround the first wire pattern 121. That is, for example, the high-dielectric constant insulating layer 153 may be formed along the circumference of the first wire pattern 121. The high-dielectric constant insulating layer 153 may also be formed between the substrate 100 and the gate electrode 140. The high-dielectric constant insulating layer 153 may also be formed between the first wire pattern 121 and the gate electrode 140. The high-dielectric constant insulating layer 153 may also be formed between the first spacer 135 and the gate electrode 140. The high-dielectric constant insulating layer 153 may also be formed between the gate spacer 151 and the gate electrode 140.

If the first wire pattern 121 comprises Si, the interface layer 155 may include a silicon oxide layer. The interface layer 155 may be formed along the circumference of the first wire pattern 121, on the top surface of the substrate 100, and between the first sacrificial pattern 171 and the gate electrode 140, but not along the sidewall of the gate spacer 151 and the sidewall of the first spacer 135.

The high-dielectric constant insulating layer 153 may comprise a high-dielectric constant material having a higher dielectric constant than a silicon oxide layer. The high-dielectric constant material may, for example, comprise at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide), lead scandium tantalum oxide, and lead zinc niobate, but the present disclosure is not limited thereto.

If the interface layer 155 is not provided, as mentioned above, the high-dielectric constant insulating layer 153 may comprise not only the high-dielectric constant material, but also a silicon oxide layer, a silicon oxynitride layer or a silicon nitride layer.

The gate spacer 151 may be formed to extend in the first direction X1. For example, the gate spacer 151 may be formed to extend in the same direction as the gate electrode 140. The gate spacer 151 may be formed to extend in the direction that intersects the first wire pattern 121.

The gate spacer 151 may be disposed between the gate electrode 140 and the semiconductor pattern 161. More specifically, the gate spacer 151 may be disposed between the gate insulating layer 157 and the semiconductor pattern 161. The gate spacer 151 may be formed on both sides of the gate electrode 140. Portions of the gate spacer 151 may face each other with respect to the gate electrode 140.

Referring back to FIG. 3, the gate spacer 151 may be formed to surround the top surface and the sides of the first wire pattern 121. The gate spacer 151 may also be formed to surround the sides of the first spacer 135. For example, the gate spacer 151 and the first spacer 135 may be formed to be placed in contact with each other.

The gate spacer 151 is illustrated as having a single-layer structure, but the present disclosure is not limited thereto. For example, the gate spacer 151 may have a multilayer structure.

Referring again to FIG. 2, the first wire pattern end 121' and the gate spacer 151 are illustrated as sharing the same interface with the semiconductor pattern 161, but the present disclosure is not limited thereto. For example, the gate spacer 151 may be formed to protrude beyond the first wire pattern end 121' toward the semiconductor pattern 161.

If the edges of part of the first wire pattern 121 that is surrounded by the gate electrode 140, are rounded by trimming, for example, then part of the first wire pattern 121, which is placed in contact with the gate spacer 151, may have a different cross-sectional shape from the part of the first wire pattern 121 that is surrounded by the gate electrode 140.

For example, the gate spacer 151 may comprise at least one of silicon nitride (SiN), silicon oxynitride (SiON), silicon oxide (SiO2), silicon oxycarbonitride (SiOCN), and a combination thereof.

Still referring to FIG. 2, the first spacer 135 may be disposed between the first wire pattern 121 and the substrate 100 and between the gate insulating layer 157 and the semiconductor pattern 161. More specifically, the first spacer 135 may be disposed between the first wire pattern 121 and the substrate 100, and between the high-dielectric constant insulating layer 153 and the semiconductor pattern 161. For example, the first spacer 135 may be formed by replacement, but the present disclosure is not limited thereto.

In some example embodiments, an interface 131 between the first spacer 135 and the gate insulating layer 157 may be curved. For example, the interface 131 between the first spacer 135 and the gate insulating layer 157 may have an arbitrary curvature. For example, the interface 131 between the first spacer 135 and the gate insulating layer 157 may be convex toward the gate electrode 140, but the present disclosure is not limited thereto. For example, the interface 131 between the first spacer 135 and the gate insulating layer 157 may have various shapes other than that set forth herein.

In some example embodiments, a side 133 of the first spacer 135 that faces the semiconductor pattern 161 may be curved. For example, the side 133 of the first spacer 135 that faces the semiconductor pattern 161 may have an arbitrary curvature. For example, the side 133 of the first spacer 135 that faces the semiconductor pattern 161 may be convex toward the gate electrode 140.

The interface 131 between the first spacer 135 and the gate insulating layer 157 may be a first sidewall 131 extending from the first wire pattern 121 toward the substrate 100. The side 133 of the first spacer 135 that faces the semiconductor pattern 161 may be a second sidewall 133 extending from the first wire pattern 121 toward the substrate 100. In some example embodiments, at least one of the first and second sidewalls 131 and 133 may be convex toward the gate electrode 140. For example, the first and second sidewalls 131 and 133 may both be convex toward the gate electrode 140.

The curvature of the side 133 of the first spacer 135 that faces the semiconductor pattern 161 may be the same as the curvature of the interface 131 between the first spacer 135 and the gate insulating layer 157, but the present disclosure is not limited thereto. For example, the curvature of the side 133 of the first spacer 135 that faces the semiconductor pattern 161 may differ from the curvature of the interface 131 between the first spacer 135 and the gate insulating layer 157.

Still referring to FIG. 2, the first spacer 135 may be placed in contact with the gate insulating layer 157. For example, the first sidewall 131 of the first spacer 135 may be placed in contact with the high-dielectric constant insulating layer 153, but the present disclosure is not limited thereto.

The first spacer 135 may be placed in contact with part of the semiconductor pattern 161. For example, the second sidewall 133 of the first spacer 135 may be placed in contact with the portion of the semiconductor pattern 161 that vertically overlaps the first wire pattern 121.

As shown in FIG. 6, the second sidewall 133 of the first spacer 135 may extend from the first wire pattern end 121' toward the substrate 100, but the present disclosure is not limited thereto. For example, the second sidewall 133 of the first spacer 135 may not necessarily extend, starting from the first wire pattern end 121'. In other words, the second sidewall 133 of the first spacer 135 may extend from a location that is an arbitrary distance from the first wire pattern end 121' toward the substrate 100.

The first spacer 135 may have different thicknesses at different arbitrary locations. More specifically, the first wire pattern 121 may have a first location P1 that is a first distance D1 from the first wire pattern end 121' and a second location P2 that is a second distance D2 from the first wire pattern end 121'. The second distance D2 may be larger than the first distance D1.

A thickness TH1 of the first spacer 135 at the first location P1 of the first wire pattern 121 may differ from a thickness TH2 of the first spacer 135 at the second location P2 of the first wire pattern 121. For example, the thickness TH1 of the first spacer 135 at the first location P1 may be smaller than the thickness TH2 of the first spacer 135 at the second location P2.

The first spacer 135 may comprise the same material as the gate spacer 151, but the present disclosure is not limited thereto. For example, the first spacer 135 may comprise a material having a different dielectric constant from the material of the gate spacer 151.

For example, the first spacer 135 may comprise a material having a lower dielectric constant than the material of the gate spacer 151. If the dielectric constant of the material of the gate spacer 151 is higher than the dielectric constant of the material of the first spacer 135, the parasitic capacitance between the gate electrode 140 and the semiconductor pattern 161 may be reduced.

If the dielectric constant of the material of the first spacer 135 is lower than the dielectric constant of the material of the gate spacer 151, the first spacer 135 may comprise, for example, at least one of a low-dielectric constant material, SiN, SiCN, SiON, SiBN, SiOCN, SiBCN, SiOC, and a combination thereof. The low-dielectric constant material may be a material having a lower dielectric constant than silicon oxide.

The semiconductor device according to some example embodiment of the present disclosure will hereinafter be described in further detail with reference to FIGS. 1, 3 through 5, 7, and 8. For clarity, descriptions of elements that have already been described above will be omitted.

FIG. 7 is an example cross-sectional view taken along line A-A' of FIG. 1.

Figure 8:
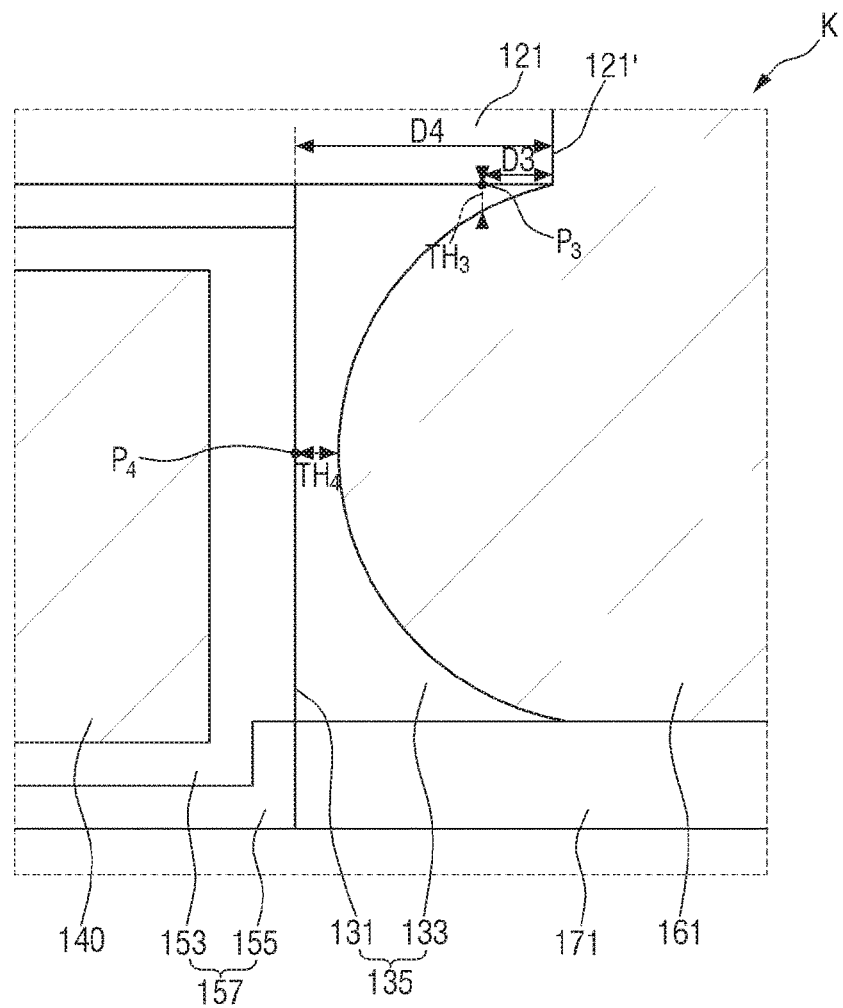
FIG. 8 is an enlarged view of an area K of FIG. 7.

FIG. 8 is an enlarged view of an area K of FIG. 7.

Referring to FIGS. 1, 3 through 5, 7, and 8, the interface 131 between the first spacer 135 and the gate insulating layer 157 may be curved. That is, the first sidewall 131 of the first spacer 135 may have an arbitrary curvature.

FIGS. 7 and 8 illustrate the first sidewall 131 of the first spacer 135 as being perpendicular to the substrate 100, but the present disclosure is not limited thereto. For example, the first sidewall 131 of the first spacer 135 may be curved with an arbitrary curvature.

The first spacer 135 may have different thicknesses at different arbitrary locations. More specifically, as shown in FIG. 8, the first wire pattern 121 may have a third location $P_3$ that is a third distance D3 from the first wire pattern end 121' and a fourth location P4 that is a fourth distance D4 from the first wire pattern end 121'. The fourth distance D4 may be larger than the third distance D3.

A thickness TH3 of the first spacer 135 at the third location P3 may differ from a thickness TH4 of the first spacer 135 at the fourth location P4. For example, the thickness TH3 of the first spacer 135 at the third location $P_3$ may be smaller than the thickness $TH_4$ of the first spacer 135 at the fourth location $P_4$.

The semiconductor device according to some example embodiments of the present disclosure will hereinafter be described in further detail with reference to FIGS. 1, 4, 5 and 9 through 12. For clarity, descriptions of elements that have already been described above will be omitted.

Figure 9:
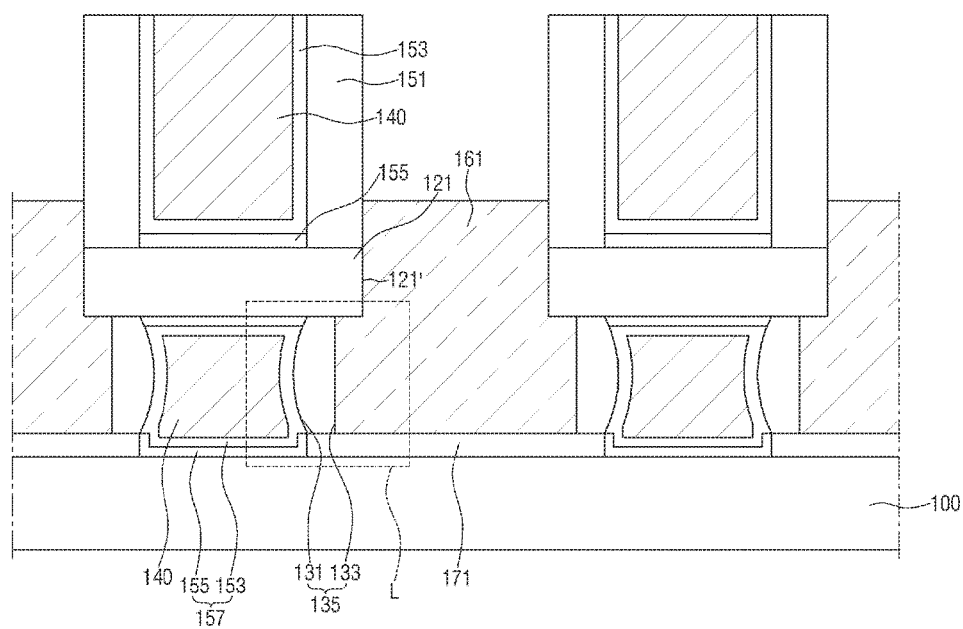
FIG. 9 is an example cross-sectional view taken along line A-A' of FIG. 1.
Figure 10:
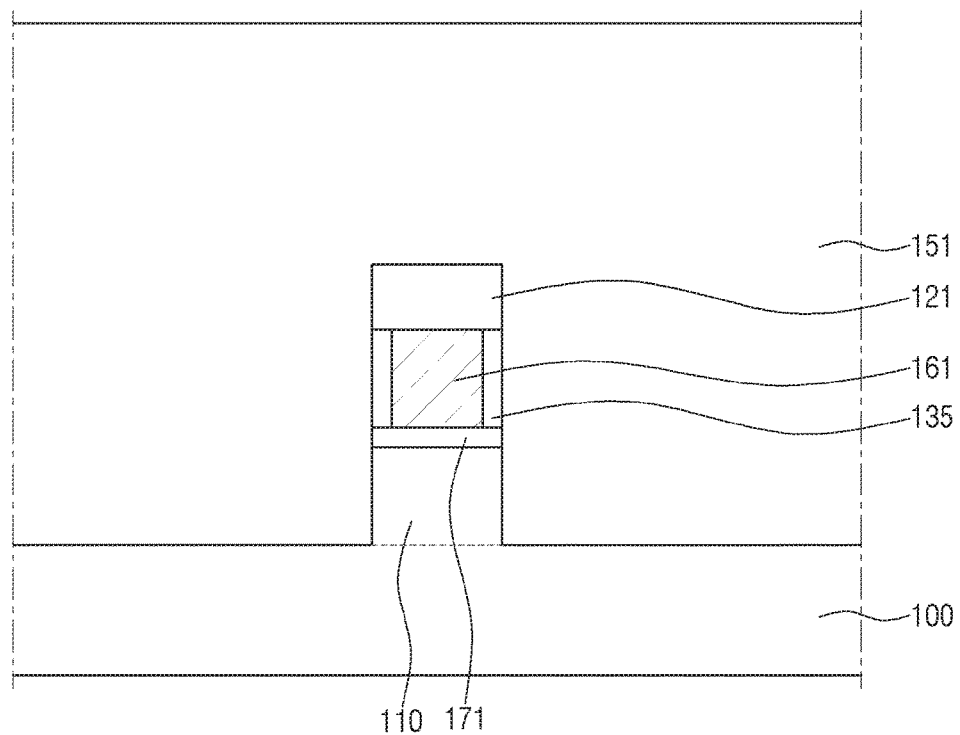
FIGS. 10 and 11 are example cross-sectional views taken along line B-B' of FIG. 1.

FIG. 9 is an example cross-sectional view taken along line A-A' of FIG. 1. FIG. 10 is an example cross-sectional view taken along line B-B' of FIG. 1, i.e., a cross-sectional view taken along a line that passes through the portion of the semiconductor pattern 161 that vertically overlaps the first wire pattern 121.

Figure 11:
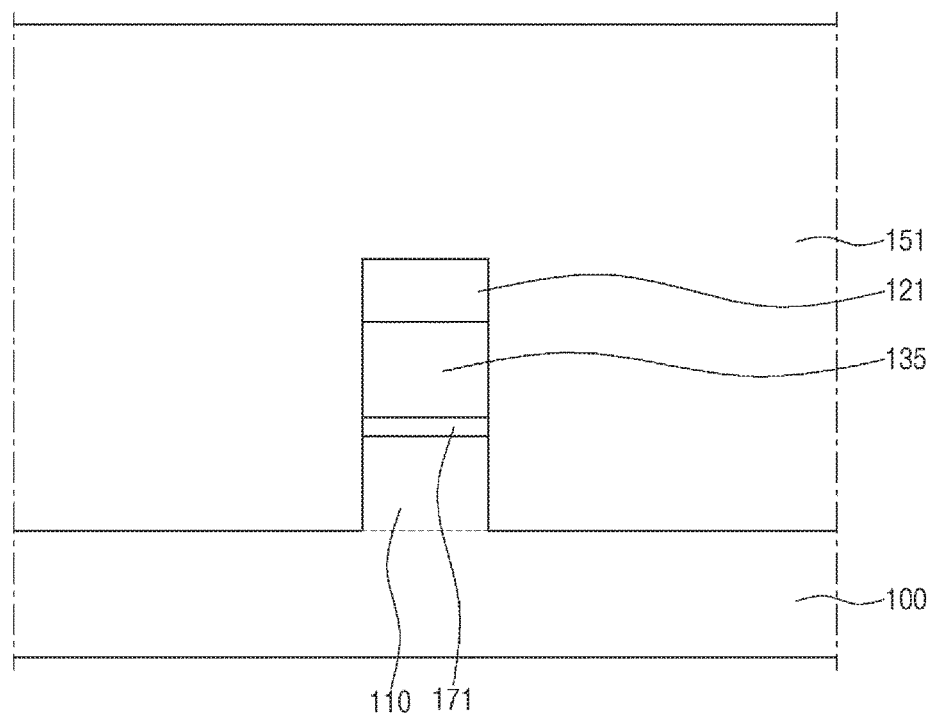

FIG. 11 is an example cross-sectional view taken along line B-B' of FIG. 1, i.e., a cross-sectional view taken along a line that passes between the first and second sidewalls 131 and 133 of the first spacer 135.

Figure 12:
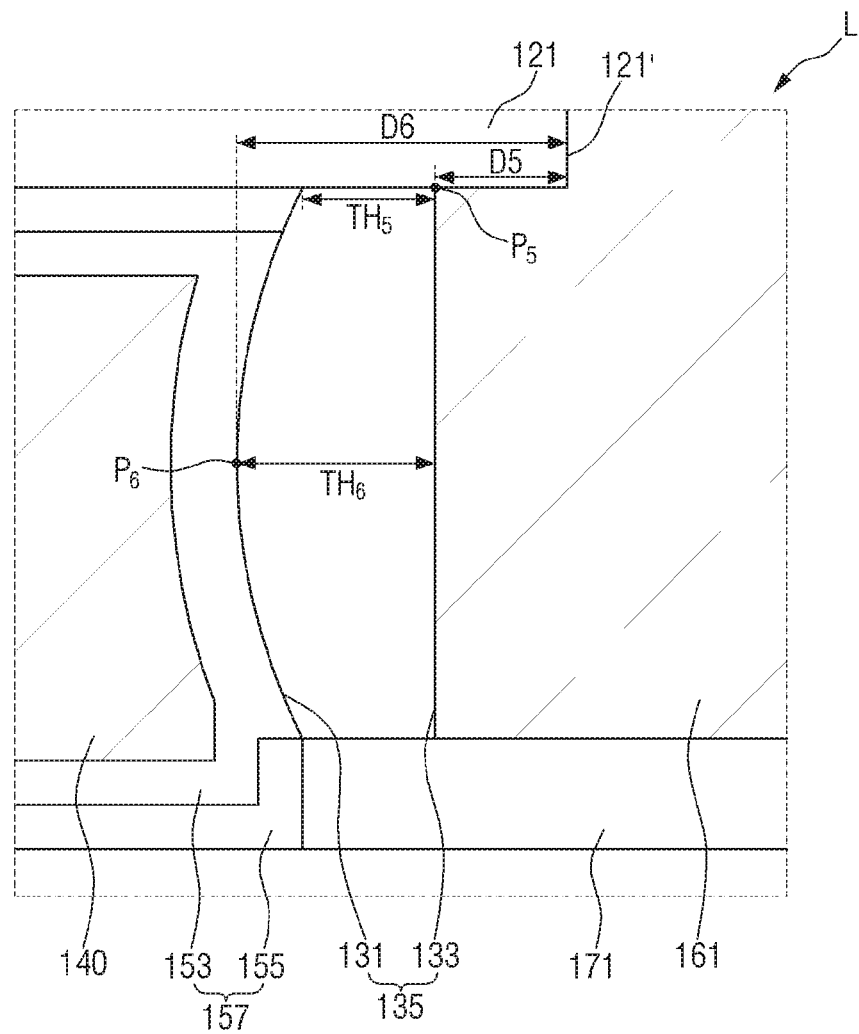
FIG. 12 is an enlarged view of an area L of FIG. 9.

FIG. 12 is an enlarged view of an area L of FIG. 9.

Referring to FIGS. 1, 4, 5 and 9 through 12, the side 133 of the first spacer 135 that faces the semiconductor pattern 161 may be curved. That is, the second sidewall 133 of the first spacer 135 may have an arbitrary curvature.

FIGS. 9 and 12 illustrate the second sidewall 133 of the first spacer 135 as being perpendicular to the substrate 100, but the present disclosure is not limited thereto. For example, the second sidewall 133 of the first spacer 135 may have a curvature close to zero.

Referring to FIG. 10, the portion of the first spacer 135 shown in FIG. 10, unlike of the first spacer 135 shown in FIG. 3, may not be disposed between the first wire pattern 121 and the semiconductor pattern 161. Also, the portion of the first spacer 135 may not be disposed between the first sacrificial pattern 171 and the semiconductor pattern 161. That is, in a cross-sectional view taken along line B-B' of FIG. 1 to pass through the portion of the semiconductor pattern 161 that vertically overlaps the first wire pattern 121, the first spacer 135 may appear to be disposed only between the gate spacer 151 and the semiconductor pattern 161.

Referring to FIG. 11, the first spacer 135 may be disposed between the first wire pattern 121 and the first sacrificial pattern 171. That is, in a cross-sectional view taken along line B-B' of FIG. 1 to pass between the first and second sidewalls 131, 133 of the first spacer 135, the first spacer 135 may appear to be disposed between the first wire pattern 121 and the first sacrificial pattern 171.

As shown in FIG. 12, the first wire pattern 121 may have a fifth location P5 that is a fifth distance D5 from the first wire pattern end 121' and a sixth location P6 that is a sixth distance D6 from the first wire pattern end 121'. In some example embodiments, the second sidewall 133 of the first spacer 135 may extend from the fifth location $P_5$ toward the substrate 100.

The first spacer 135 may have different thicknesses at different arbitrary locations. The sixth distance D6 may be larger than the fifth distance D5.

More specifically, a thickness $TH_5$ of the first spacer 135 at the fifth location $P_5$ may differ from a thickness $TH_6$ of the first spacer 135 at the sixth location $P_6$. For example, the thickness $TH_5$ of the first spacer 135 at the fifth location P5 may be smaller than the thickness TH6 of the first spacer 135 at the sixth location P6.

The semiconductor device according to some example embodiments of the present disclosure will hereinafter be described in further detail with reference to FIGS. 1, 4, 5, 10, 11, 13 and 14. For clarity, descriptions of elements that have already been described above will be omitted.

Figure 13:
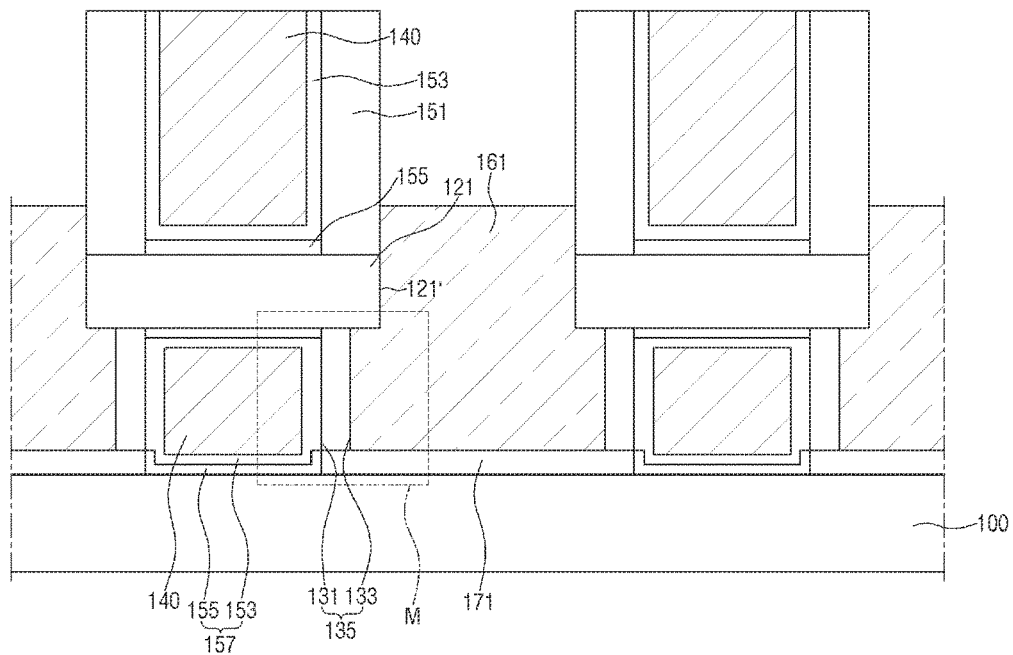
FIG. 13 is an example cross-sectional view taken along line A-A' of FIG. 1.

FIG. 13 is an example cross-sectional view taken along line A-A' of FIG. 1.

Figure 14:
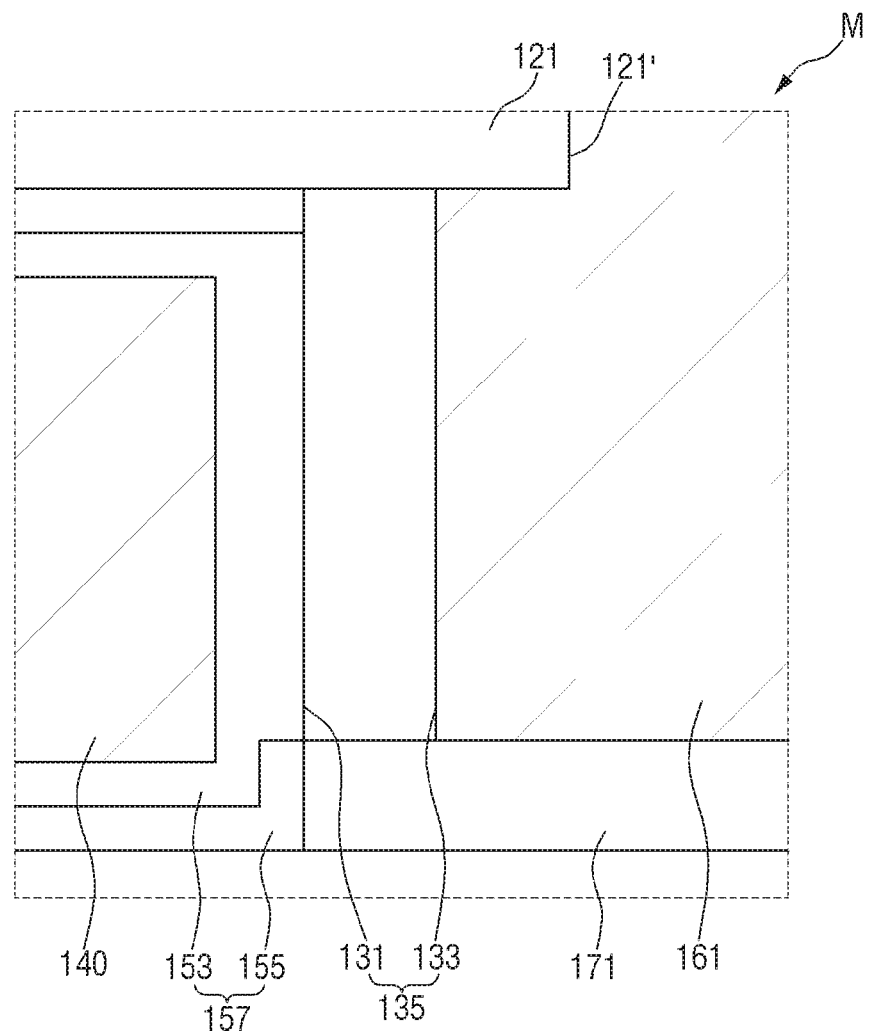
FIG. 14 is an enlarged view of an area M of FIG. 13.

FIG. 14 is an enlarged view of an area M of FIG. 13.

Referring to FIGS. 1, 4, 5, 10, 11, 13 and 14, the interface 131 between the first spacer 135 and the gate insulating layer 157 may be curved. Also, the side 133 of the first spacer 135 that faces the semiconductor pattern 161 may be curved. That is, the first and second sidewalls 131 and 133 of the first spacer 135 may both have an arbitrary curvature.

FIGS. 13 and 14 illustrate the first and second sidewalls 131, 133 of the first spacer 135 as being perpendicular to the substrate 100, but the present disclosure is not limited thereto. For example, the first and second sidewalls 131, 133 of the first spacer 135 may both have a curvature close to zero.

By modifying the shape of the first spacer 135, the epitaxial growth of a source/drain region, which is a subsequent process to the formation of the first spacer 135, may be smoothly performed.

More specifically, if the second sidewall 133 of the first spacer 135 extends from the first wire pattern end 121' toward the substrate 100 and is perpendicular to the substrate 100, an epitaxial growth process may not be properly performed, and thus, an air gap may be formed between the first spacer 135 and the semiconductor pattern 161.

However, if the shape of the first spacer 135 is modified as performed in some example embodiments, the thickness of the first spacer 135 (i.e., the thickness $TH_1$) in an area where the first spacer 135 is placed in contact with the first wire pattern 121 may be reduced, and as a result, an epitaxial growth process may be smoothly performed, thereby reducing the formation of an air gap.

The semiconductor device according to some example embodiments will hereinafter be described in further detail with reference to FIGS. 1 and 15. For clarity, descriptions of elements that have already been described above will be omitted.

Figure 15:
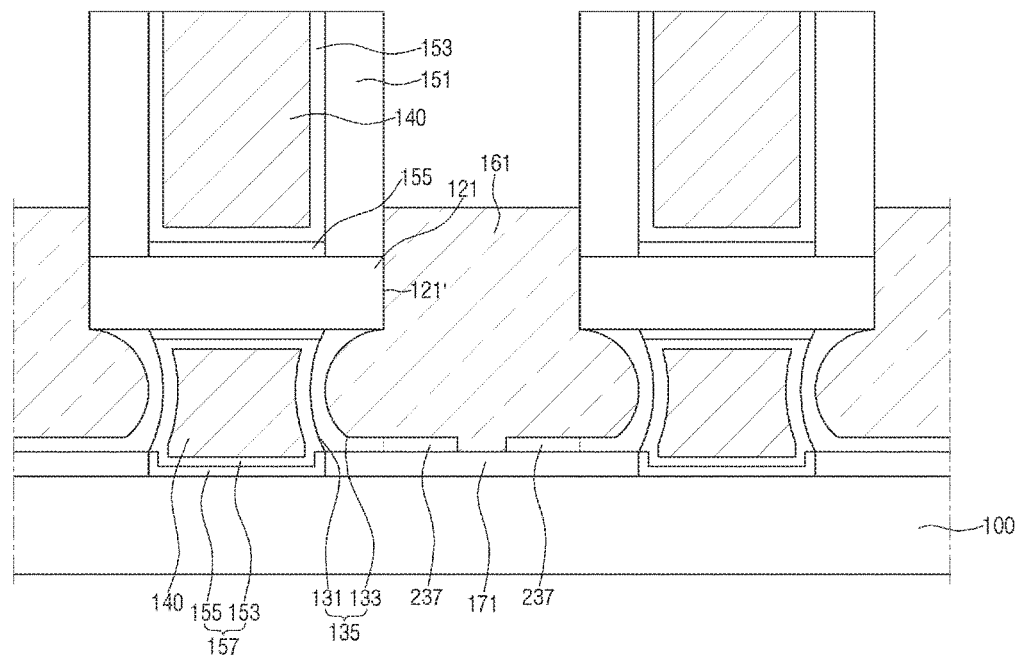
FIGS. 15 through 17B are example cross-sectional views taken along line A-A' of FIG. 1.

FIG. 15 is an example cross-sectional view taken along line A-A' of FIG. 1.

Referring to FIGS. 1 and 15, a lower spacer pattern 237 may be formed on the first sacrificial pattern 171. In other words, the lower spacer pattern 237 may be disposed between the substrate 100 and the semiconductor pattern 161. However, the present disclosure is not limited to the example embodiment of FIG. 15. That is, as illustrated in FIGS. 2 through 14, no lower spacer pattern 237 may be provided.

The lower spacer pattern 237 may extend from the first spacer 135. In some example embodiments, the lower spacer pattern 237 may be formed to expose part of the first sacrificial pattern 171. That is, the lower spacer pattern 237 may be discontinuous. In other words, as shown in FIG. 15, the lower spacer pattern 237 may include a first lower spacer pattern and a second lower spacer pattern, between the substrate 100 and the semiconductor pattern 161, which are spaced apart from each other.

The semiconductor pattern 161 may be placed in contact with part of the first sacrificial pattern 171 that is exposed by the lower spacer pattern 237. FIG. 15 illustrates the first and second sidewalls 131 and 133 of the first spacer 135 as being convex toward the gate electrode 140, but the present disclosure is not limited thereto. For example, only one of the first and second sidewalls 131 and 133 of the first spacer 135 may be convex toward the gate electrode 140. In other words, at least one of the first and second sidewalls 131 and 133 of the first spacer 135 may have an arbitrary curvature, for example, a curvature close to zero.

The semiconductor device according to some example embodiments will hereinafter be described in further detail with reference to FIGS. 1 and 16. For clarity, descriptions of elements that have already been described above will be omitted.

Figure 16:
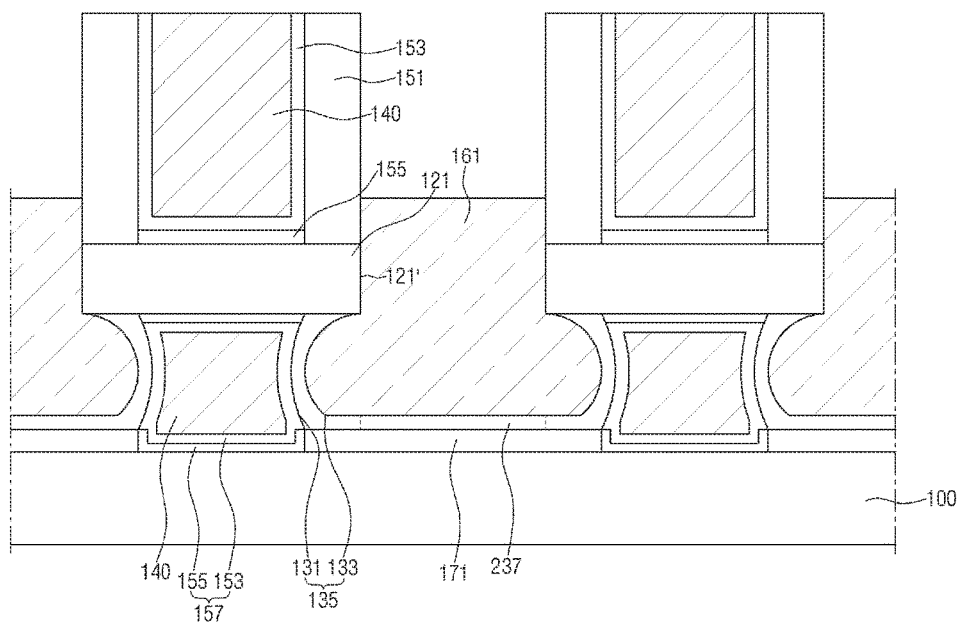

FIG. 16 is an example cross-sectional view taken along line A-A' of FIG. 1.

Referring to FIG. 16, the lower spacer pattern 237 may be formed on the first sacrificial pattern 171. The lower spacer pattern 237 of FIG. 16, unlike the lower spacer pattern 237 of FIG. 15, may not expose the first sacrificial pattern 171. FIG. 16 illustrates the first and second sidewalls 131, 133 of the first spacer 135 as being convex toward the gate electrode 140, but the present disclosure is not limited thereto. That is, for example, only one of the first and second sidewalls 131, 133 of the first spacer 135 may be convex toward the gate electrode 140. In other words, at least one of the first and second sidewalls 131, 133 of the first spacer 135 may have an arbitrary curvature, for example, a curvature close to zero.

The semiconductor device according to some example embodiments will hereinafter be described in further detail with reference to FIGS. 1 and 17A through 20. For clarity, descriptions of elements that have already been described above will be omitted.

Figure 17A:
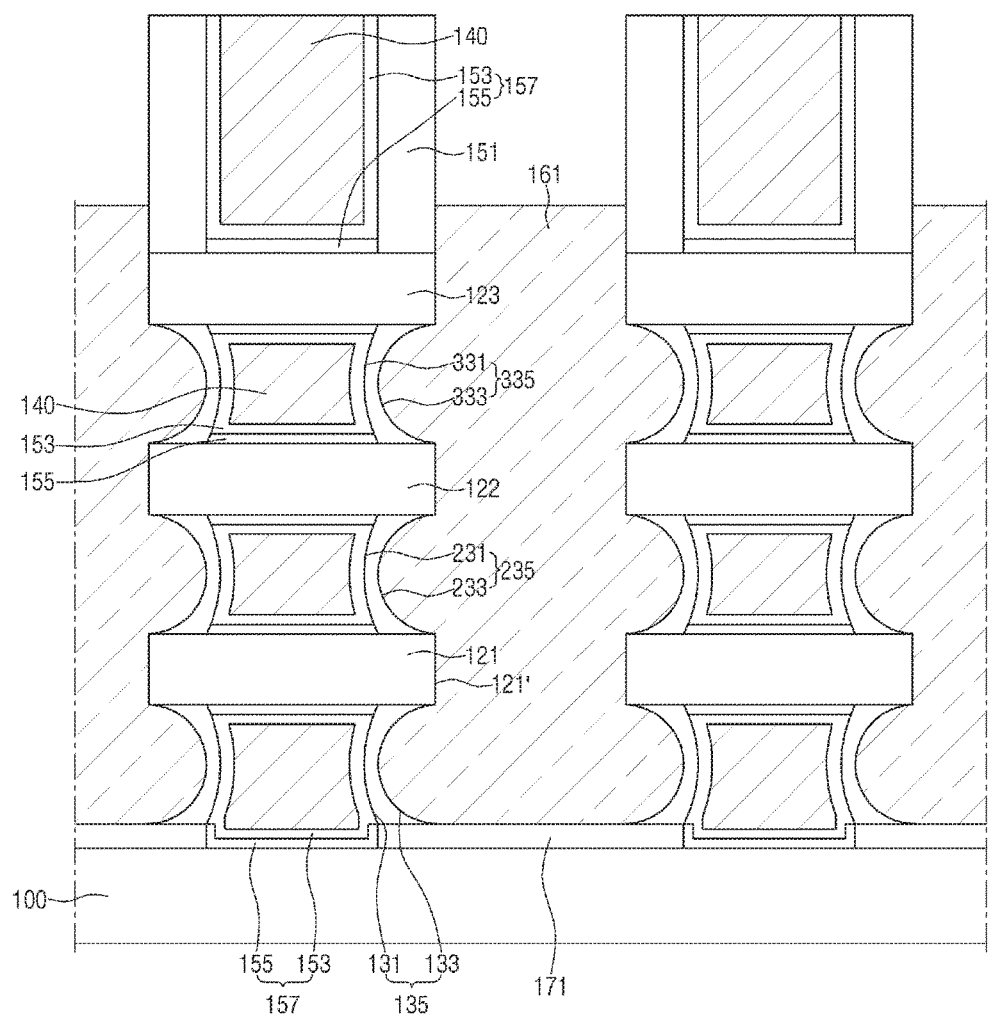
Figure 17B:
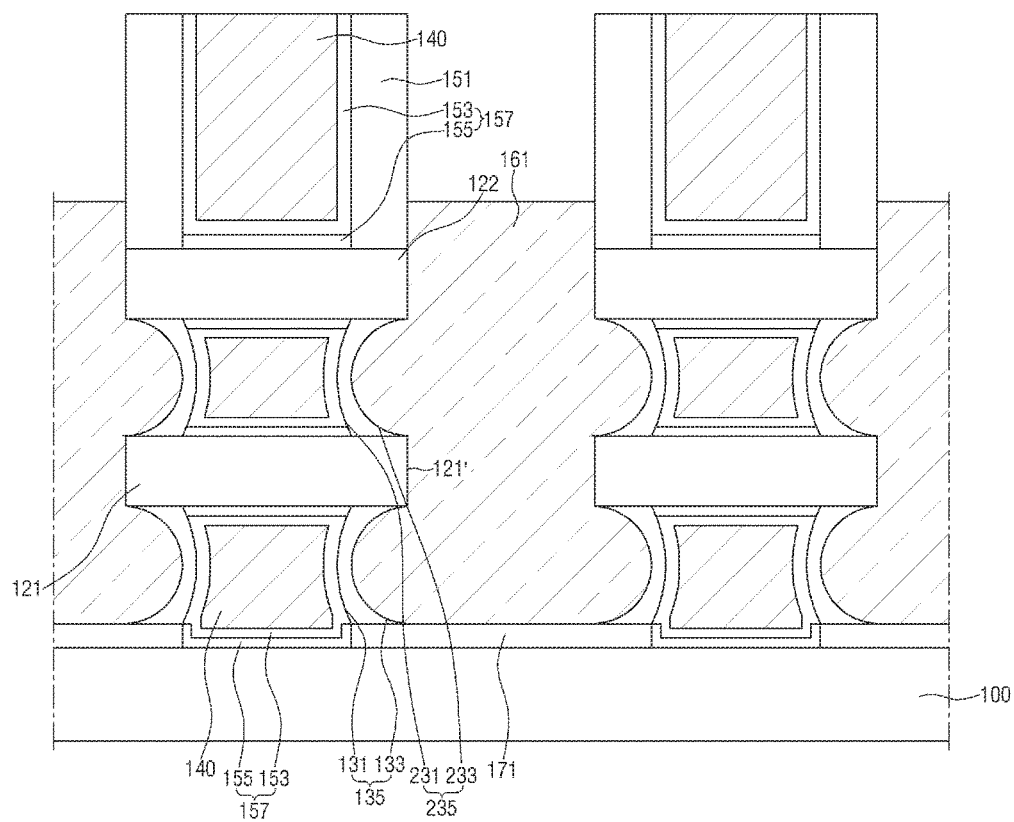

FIGS. 17A and 17B are example cross-sectional views taken along line A-A' of FIG. 1.

Figure 18:
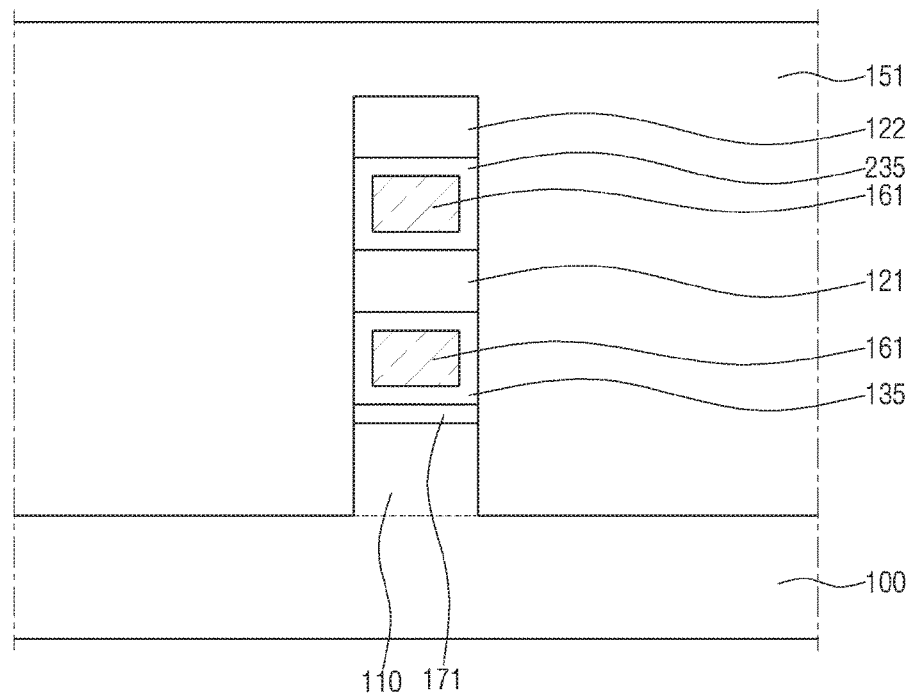
FIG. 18 is an example cross-sectional view taken along line B-B' of FIG. 1.

FIG. 18 is an example cross-sectional view taken along line B-B' of FIG. 1.

Figure 19:
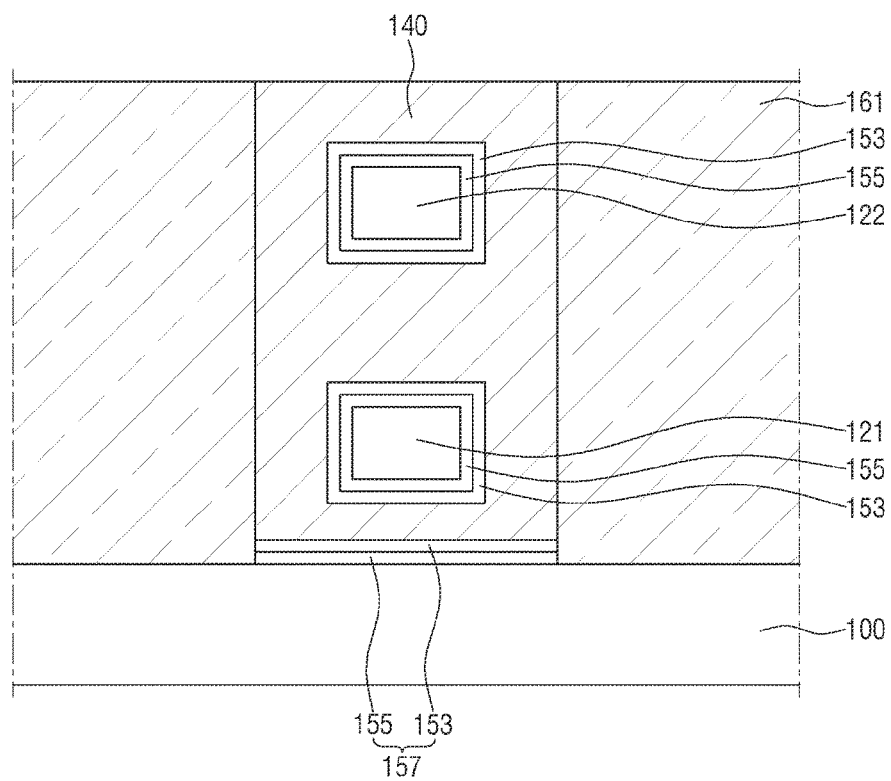
FIG. 19 is an example cross-sectional view taken along line C-C' of FIG. 1.

FIG. 19 is an example cross-sectional view taken along line C-C' of FIG. 1.

Figure 20:
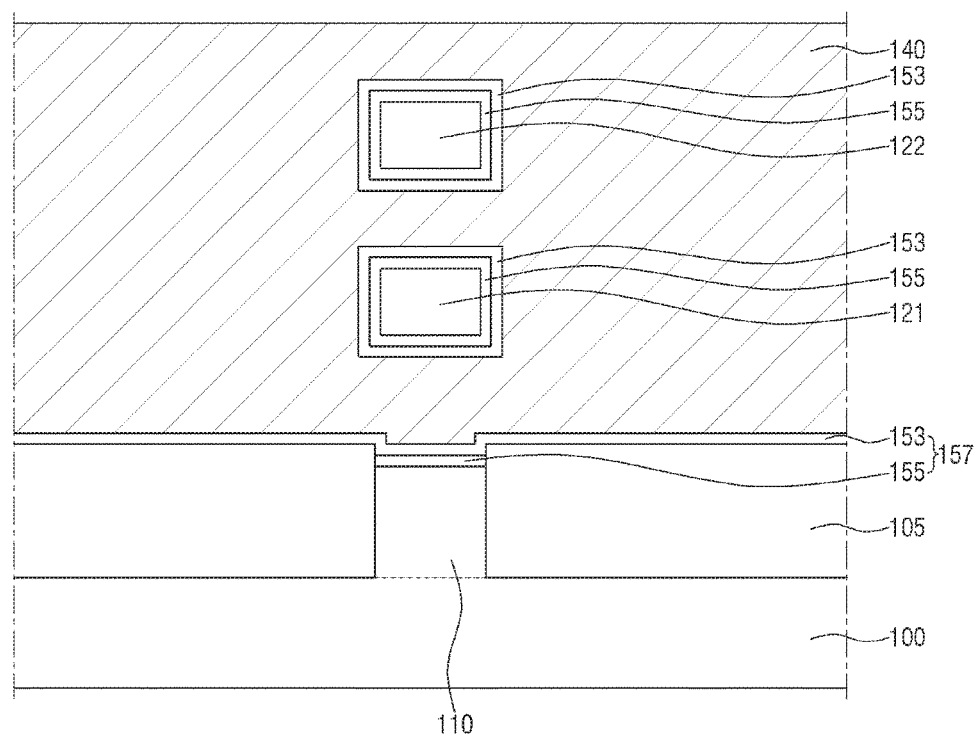
FIG. 20 is an example cross-sectional view, taken along line D-D' of FIG. 1.

FIG. 20 is an example cross-sectional view taken along line D-D' of FIG. 1.

Referring to FIGS. 1, 17A, and 17B, the semiconductor device according to some example embodiments may further include second and third wire patterns 122, 123, which are disposed on the first wire pattern 121 and are isolated from the first wire pattern 121.

In other words, as mentioned above, the semiconductor device according to some example embodiments may include a plurality of wire patterns.

The second and third wire patterns 122, 123 may be formed on the substrate 100 to be isolated from the substrate 100. The second and third wire patterns 122, 123 may extend in the second direction X2, but the present disclosure is not limited thereto. For example, the second and third wire patterns 122, 123 may extend in a different direction from the gate electrode 140. The second and third wire patterns 122, 123 may extend to penetrate the gate electrode 140.

A third spacer 335 may include fifth and sixth sidewalls 331, 333, which extend from the third wire pattern 123 to the second wire pattern 122. The fifth and sixth sidewalls 331 and 333 may both have an arbitrary curvature. For example, the fifth and sixth sidewalls 331 and 333 may both be convex toward the gate electrode 140. FIG. 17A illustrates the fifth and sixth sidewalls 331 and 333 as being curved, but the present disclosure is not limited thereto. For example, the fifth and sixth sidewalls 331, 333 may both have a curvature close to zero.

FIG. 17A illustrates an example in which no lower spacer pattern 237 is provided on the first sacrificial pattern 171, but the present disclosure is not limited thereto. That is, the semiconductor device according to some example embodiments, which has a plurality of wire patterns, may further include the lower spacer pattern 237 on the first sacrificial pattern 171. In some example embodiments, the lower spacer pattern 237 may be discontinuous. In some example embodiments, the second and third wire patterns 122 and 123 may not extend into the semiconductor pattern 161, but the present disclosure is not limited thereto. That is, the second and third wire patterns 122, 123 may extend into the semiconductor pattern 161 and may thus be surrounded by the semiconductor pattern 161.

The length of the second and third wire patterns 122, 123 is illustrated as being the same as the length from one side of the gate spacer 151 to the other side of the gate spacer 151, but the present disclosure is not limited thereto. That is, the second and third wire patterns 122, 123 may be formed to protrude beyond the gate spacer 151.

In the following description, it is assumed that the semiconductor device according to some example embodiments includes, for example, two wire patterns. Referring again to FIGS. 1 and 17B through 20, the second wire pattern 122 may have a rectangular cross-sectional shape, but the present disclosure is not limited thereto. That is, the edges of the second wire pattern 122 may be rounded by, for example, trimming.

The second wire pattern 122 may, for example, comprise the same material as the first wire pattern 121. The second wire pattern 122 may be used as a channel region of a transistor.

The semiconductor pattern 161 may be disposed not only on both sides of the first wire pattern 121, but also on both sides of the second wire pattern 122. The semiconductor pattern 161 may have a portion that vertically overlaps the second wire pattern 122. The portion of the semiconductor pattern 161 that vertically overlaps the second wire pattern 122 may differ from the portion of the semiconductor pattern 161 that vertically overlaps the first wire pattern 121. The portion of the semiconductor pattern 161 that vertically overlaps the second wire pattern 122 may be recessed toward the gate electrode 140 between the substrate 100 and the second wire pattern 122. The semiconductor pattern 161 may have another portion that is placed in contact with a second spacer 235 that will be described later.

In some example embodiments, the semiconductor pattern 161 may be formed to surround the first wire pattern end 121'.

The gate electrode 140 may surround the second wire pattern 122. The gate electrode 140 may also be formed in the space between the first and second wire patterns 121, 122.

The gate insulating layer 157 may be formed not only between the gate electrode 140 and the first wire pattern 121, but also between the second wire pattern 122 and the gate electrode 140.

The gate insulating layer 157 may be formed to surround the second wire pattern 122. That is, for example, the gate insulating layer 157 may be formed along the circumference of the second wire pattern 122.

The second spacer 235 may be disposed between the first and second wire patterns 121, 122 and between the gate insulating layer 157 and the semiconductor pattern 161.

In some example embodiments, an interface 231 between the second spacer 235 and the gate insulating layer 157 may be curved. For example, the interface 231 between the second spacer 235 and the gate insulating layer 157 may have an arbitrary curvature. For example, the interface 231 between the second spacer 235 and the gate insulating layer 157 may be convex toward the gate electrode 140, but the present disclosure is not limited thereto. That is, for example, the interface 231 between the second spacer 235 and the gate insulating layer 157 may have various shapes other than that set forth herein.

In some example embodiments, a side 233 of the second spacer 235 that faces the semiconductor pattern 161 may be curved. For example, the side 233 of the second spacer 235 that faces the semiconductor pattern 161 may have an arbitrary curvature. For example, the side 233 of the second spacer 235 that faces the semiconductor pattern 161 may be convex toward the gate electrode 140.

The interface 231 between the second spacer 235 and the gate insulating layer 157 may be a third sidewall 231 extending from the second wire pattern 122 toward the substrate 100. The side 233 of the second spacer 235 that faces the semiconductor pattern 161 may be a fourth sidewall 233 extending from the second wire pattern 122 toward the substrate 100. In some example embodiments, at least one of the third and fourth sidewalls 231, 233 may be convex toward the gate electrode 140. For example, the third and fourth sidewalls 231, 233 may both be convex toward the gate electrode 140.

The curvature of the side 233 of the second spacer 235 that faces the semiconductor pattern 161 may be the same as the curvature of the interface 231 between the second spacer 235 and the gate insulating layer 157, but the present disclosure is not limited thereto. That is, the curvature of the side 233 of the second spacer 235 that faces the semiconductor pattern 161 may differ from the curvature of the interface 231 between the second spacer 235 and the gate insulating layer 157.

Still referring to FIG. 17a, the second spacer 235 may be placed in contact with the gate insulating layer 157. For example, the third sidewall 231 of the second spacer 235 may be placed in contact with the high-dielectric constant insulating layer 153, but the present disclosure is not limited thereto.

The fourth sidewall 233 of the second spacer 235 may extend from the first wire pattern end 121' to the second wire pattern 122, but the present disclosure is not limited thereto. That is, the fourth sidewall 233 of the second spacer 235 may not necessarily extend, starting from the first wire pattern end 121'. In other words, the fourth sidewall 233 of the second spacer 235 may extend from a location that is an arbitrary distance from the first wire pattern end 121' to the second wire pattern 122.

The second spacer 235, like the first spacer 135, may have different thicknesses at different arbitrary locations. For example, the second spacer 235, like the first spacer 135, has different thicknesses at the first wire pattern end 121' and at a location adjacent to the gate insulating layer 157.

The second spacer 235 may comprise the same material as the first spacer 135.

The semiconductor device according to some example embodiment will hereinafter be described in further detail with reference to FIGS. 1 and 18 through 21. For clarity, descriptions of elements that have already been described above will be omitted.

Figure 21:
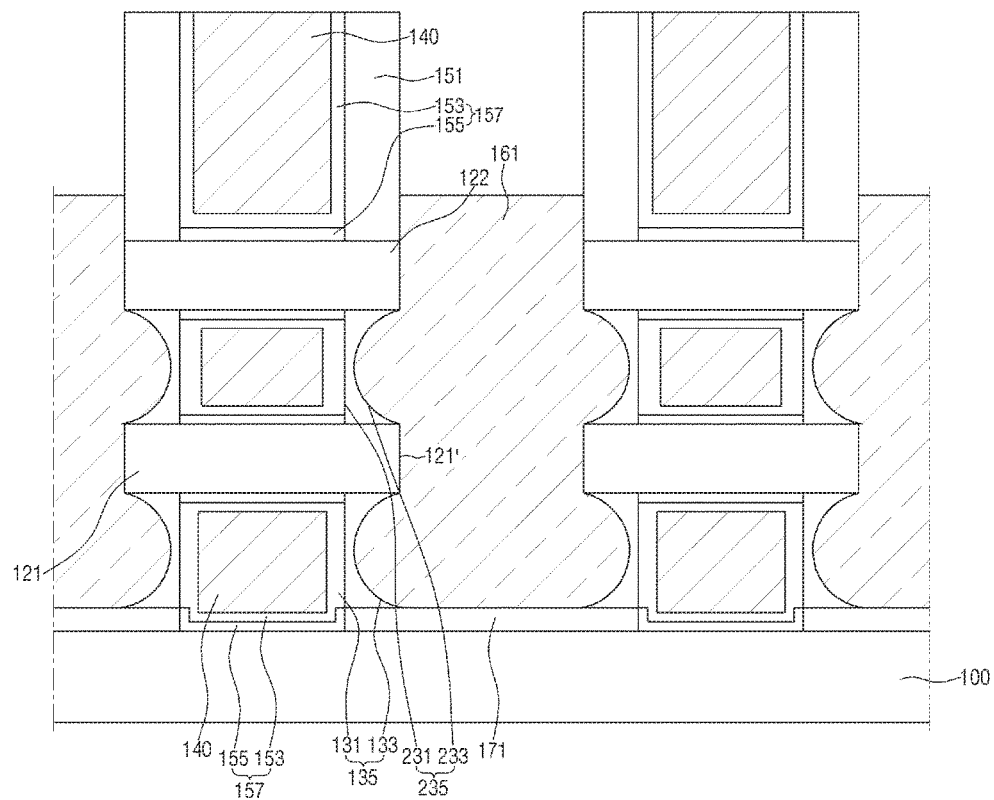
FIGS. 21 and 22 are example cross-sectional views taken along line A-A' of FIG. 1.

FIG. 21 is an example cross-sectional view taken along line A-A' of FIG. 1.

Referring to FIGS. 1 and 18 through 21, the interface 231 between the second spacer 235 and the gate insulating layer 157 may be curved. That is, the third sidewall 231 of the second spacer 235 may have an arbitrary curvature.

Referring to FIG. 21, which illustrates the third sidewall 231 of the second spacer 235 as being perpendicular to the substrate 100, but the present disclosure is not limited thereto. That is, the third sidewall 231 of the second spacer 235 may have a curvature close to zero.

The semiconductor device according to some example embodiment will hereinafter be described in further detail with reference to FIGS. 1, 19, 20, and 22 through 24. For clarity, descriptions of elements that have already been described above will be omitted.

Figure 22:
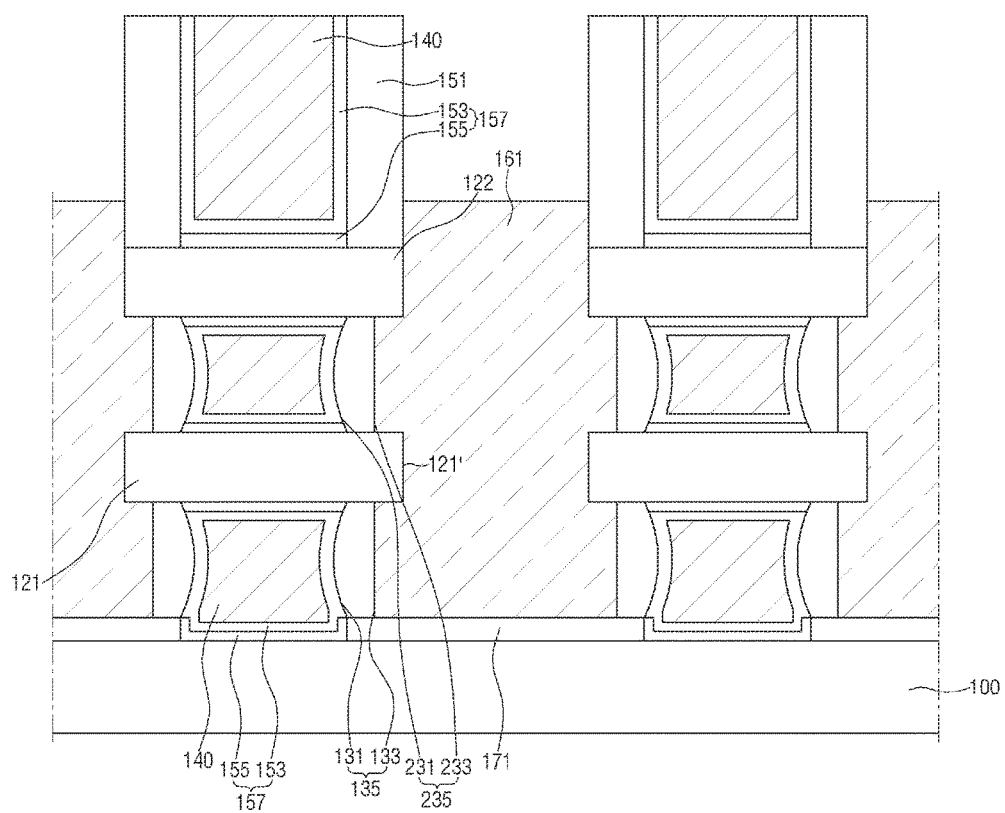
Figure 23:
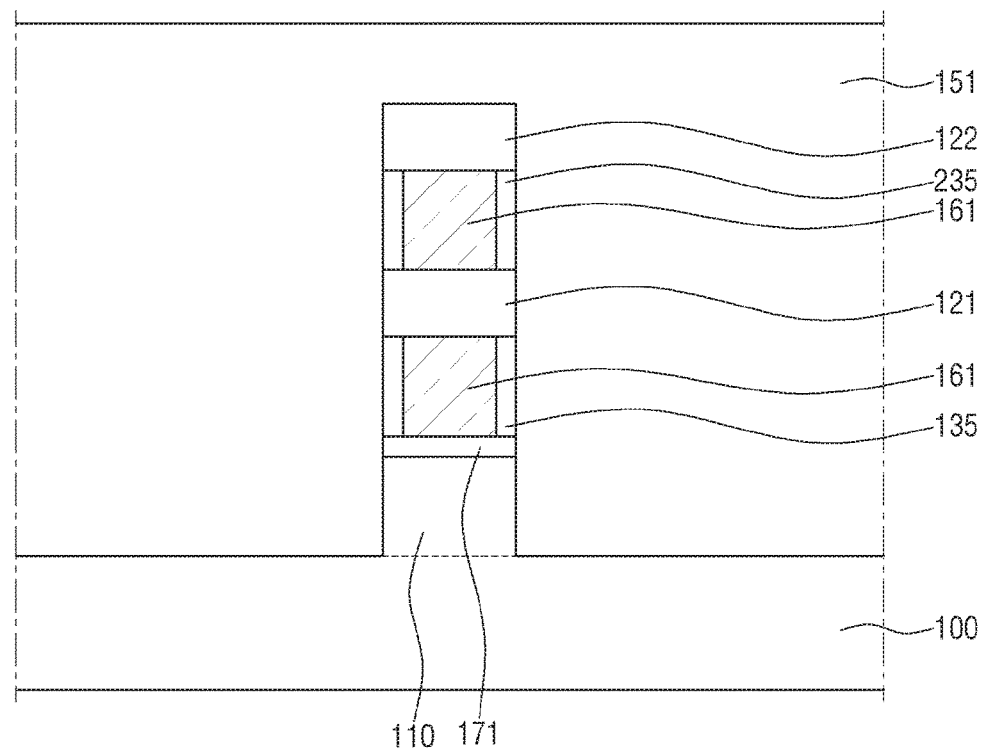
FIGS. 23 and 24 are example cross-sectional views taken along line B-B' of FIG. 1.

FIG. 22 is an example cross-sectional view taken along line A-A' of FIG. 1. FIG. 23 is an example cross-sectional view taken along line B-B' of FIG. 1, i.e., a cross-sectional view taken along a line that passes through the portion of the semiconductor pattern 161 that vertically overlaps the first wire pattern 121.

Figure 24:
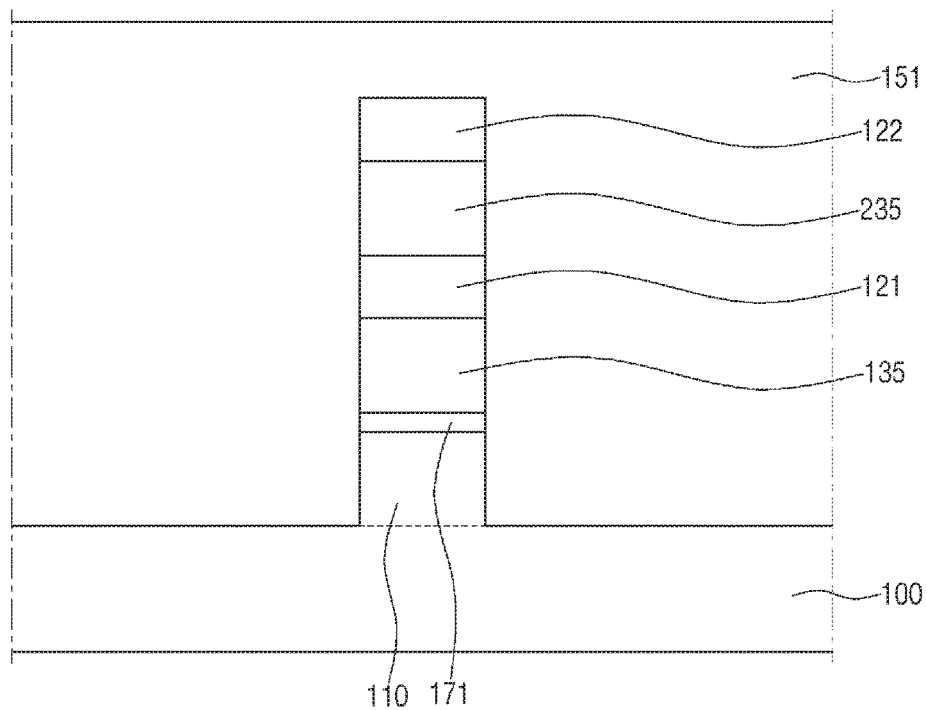

FIG. 24 is an example cross-sectional view taken along line B-B' of FIG. 1, i.e., a cross-sectional view taken along a line that passes between the first and second sidewalls 131 and 133 of the first spacer 135.

Referring to FIGS. 1, 19, 20, and 22 through 24, the side 233 of the second spacer 235 that faces the semiconductor pattern 161 may be curved. That is, the fourth sidewall 233 of the second spacer 235 may have an arbitrary curvature.

FIG. 22 illustrates the fourth sidewall 233 of the second spacer 235 as being perpendicular to the substrate 100, but the present disclosure is not limited thereto. That is, the fourth sidewall 233 of the second spacer 235 may have a curvature close to zero.

Referring to FIG. 23, the portion of the second spacer 235 may not be disposed between the second wire pattern 122 and the semiconductor pattern 161. Also, the portion of the second spacer 235 may not be disposed between the first wire pattern 121 and the semiconductor pattern 161. That is, for example, in a cross-sectional view taken along line B-B' of FIG. 1 to pass through the portion of the semiconductor pattern 161 that vertically overlaps the first wire pattern 121, the second spacer 235 may appear to be disposed only between the gate spacer 151 and the semiconductor pattern 161.

Referring to FIG. 24, the second spacer 235 may be disposed between the first and second wire patterns 121, 122. That is, in a cross-sectional view taken along line B-B' of FIG. 1 to pass between the first and second sidewalls 131, 133 of the first spacer 135, the second spacer 235 may appear to be disposed between the first and second wire patterns 121 and 122.

The semiconductor device according to some example embodiments will hereinafter be described in further detail with reference to FIGS. 1, 19, 20, and 23 through 25. For clarity, descriptions of elements that have already been described above will be omitted.

Figure 25:
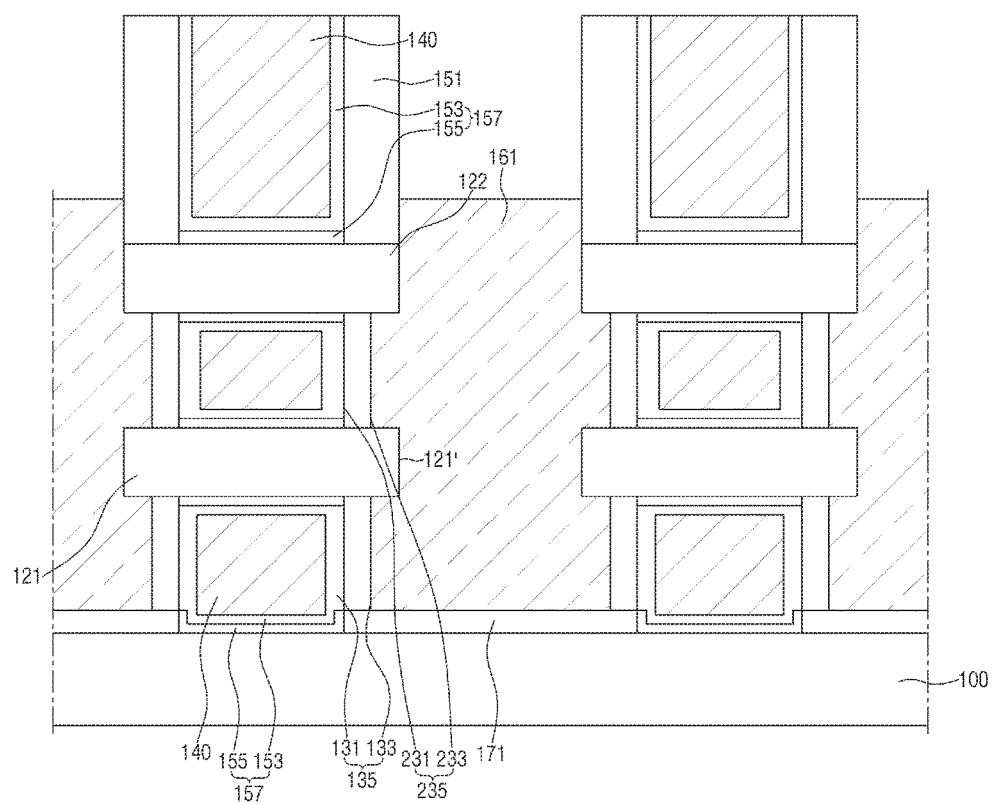
FIG. 25 is an example cross-sectional view, taken along line A-A' of FIG. 1.

FIG. 25 is an example cross-sectional view taken along line A-A' of FIG. 1.

Referring to FIGS. 1, 19, 20, and 23 through 25, the interface 231 between the second spacer 235 and the gate insulating layer 157 may be curved. Also, the side 233 of the second spacer 235 that faces the semiconductor pattern 161 may be curved. That is, the third and fourth sidewalls 231 and 233 of the second spacer 235 may both have an arbitrary curvature.

FIG. 25 illustrates the third and fourth sidewalls 231 and 233 of the second spacer 235 as being perpendicular to the substrate 100, but the present disclosure is not limited thereto. For example, the third and fourth sidewalls 231 and 233 of the second spacer 235 may both have a curvature close to zero.

A method of fabricating the semiconductor device according to some example embodiments will hereinafter be described with reference to FIGS. 1, 17B, 21, 22, and 25 through 33. For clarity, descriptions of elements that have already been described above will be omitted.

FIGS. 26-33 are cross-sectional views illustrating intermediate steps of a method of fabricating the semiconductor device according to some example embodiments. More specifically, FIGS. 26 through 33 are example cross-sectional views taken along line A-A' of FIG. 1.

Figure 26:
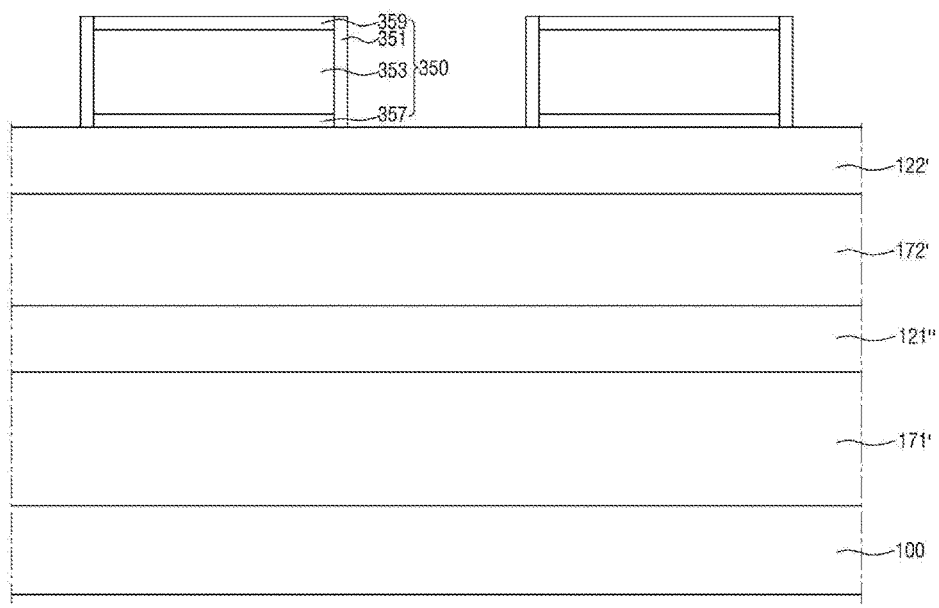
FIGS. 26 through 33 are cross-sectional views illustrating intermediate steps of a method of fabricating the semiconductor device according to some example embodiments.

Referring to FIG. 26, a mold layer may be formed on the substrate 100.

The mold layer may include a first sacrificial layer 171', a first wire layer 121", a second sacrificial layer 172', and a second wire layer 122', which are sequentially stacked. FIG. 26 illustrates that the mold layer includes only one first sacrificial layer 171', only one first wire layer 121", only one second sacrificial layer 172', and only one second wire layer 122', but the present disclosure is not limited thereto. For example, the mold layer may include more than two sacrificial layers and more than two wire layers that are alternately stacked.

The first and second sacrificial layer 171' and 172' may comprise the same material as the first sacrificial pattern 171.

At least one dummy gate structure 350 may be formed on the mold layer. The dummy gate structure 350 may include a dummy gate spacer 351, a dummy gate electrode 353, a dummy gate insulating layer 357, and a hard mask 359.

Figure 27:
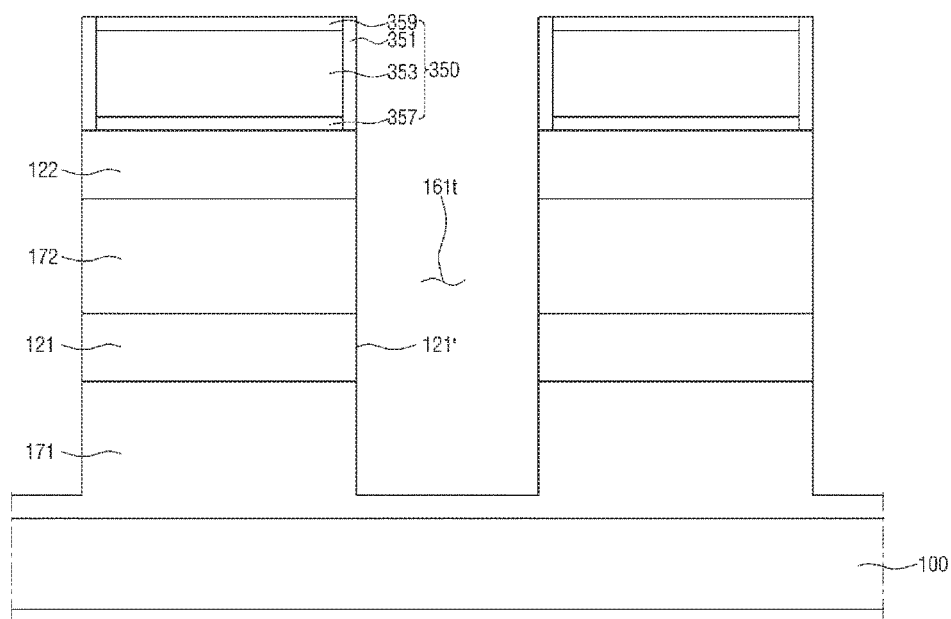

Referring to FIG. 27, a trench 161t may be formed in the mold layer. The trench 161t may be formed using the dummy gate structure 350 as a mask. The bottom of the trench 161t may be defined by the first sacrificial pattern 171. In other words, in some example embodiments, the trench 161t may be formed not to expose the top surface of the substrate 100.

The first sacrificial pattern 171 may be formed not only on part of the substrate 100 that is overlapped by the dummy gate structure 350, but also on part of the substrate 100 that is not overlapped by the dummy gate structure 350. In some example embodiments, the height of the first sacrificial pattern 171 over the part of the substrate 100 that is overlapped by the dummy gate structure 350 may differ from the height of the first sacrificial pattern 171 over the part of the substrate 100 that is not overlapped by the dummy gate structure 350. The height of the first sacrificial pattern 171 may denote the height from the top surface of the substrate 100 to the top surface of the first sacrificial pattern 171.

The first sacrificial pattern 171, the first wire pattern 121, a second sacrificial pattern 172, and the second wire pattern 122 may be formed by the formation of the trench 161t. For example, the trench 161t may expose the first wire pattern end 121'.

Figure 28:
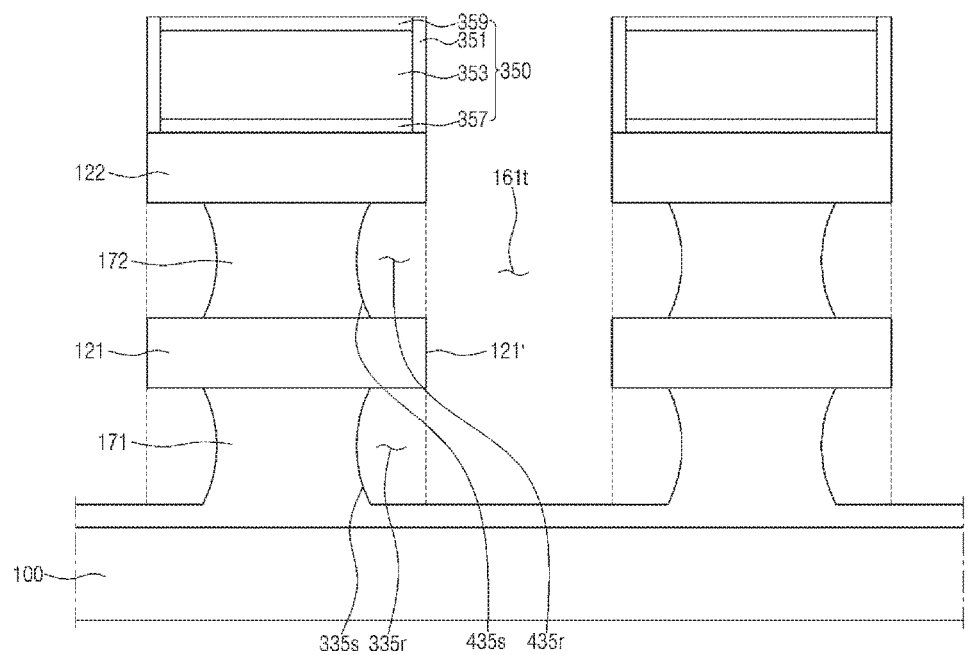

Referring to FIG. 28, first and second recesses 335r and 435r may be formed. The first recess 335r may be formed between the substrate 100 and the first wire pattern 121. The first recess 335r may be formed by removing part of the first sacrificial pattern 171 that is exposed by the trench 161t.

The sidewall of the first recess 335r may be defined by the first wire pattern 121. A bottom 335s of the first recess 335r may extend from the first wire pattern 121 toward the substrate 100. For example, the bottom 335s of the first recess 335r may extend from a location that is an arbitrary distance from the first wire pattern end 121' toward the substrate 100.

The second recess 435r may be formed between the first and second wire patterns 121 and 122. The second recess 435r may be formed by removing part of the second sacrificial pattern 172 that is exposed by the trench 161t.

The sidewall of the second recess 435r may be defined by parts of the first and second wire patterns 121, 122 that are exposed by the second recess 435r. A bottom 435s of the second recess 435r may be defined by the second sacrificial pattern 172. The bottom 435s of the second recess 435r may extend from the second wire pattern 122 to the first wire pattern 121. For example, the bottom 435s of the second recess 435r may extend from a location that is an arbitrary distance from the first wire pattern end 121' to the second wire pattern 122.

The bottom 335s of the first recess 335r, and the bottom 435s of the second recess 435r may be curved, for example. That is, the bottom 335s of the first recess 335r and the bottom 435s of the second recess 435r may both have an arbitrary curvature. The bottom 335s of the first recess 335r and the bottom 435s of the second recess 435r are illustrated as being curved, but the present disclosure is not limited thereto. That is, the bottom 335s of the first recess 335r and the bottom 435s of the second recess 435r may both have a curvature close to zero.

Figure 29:
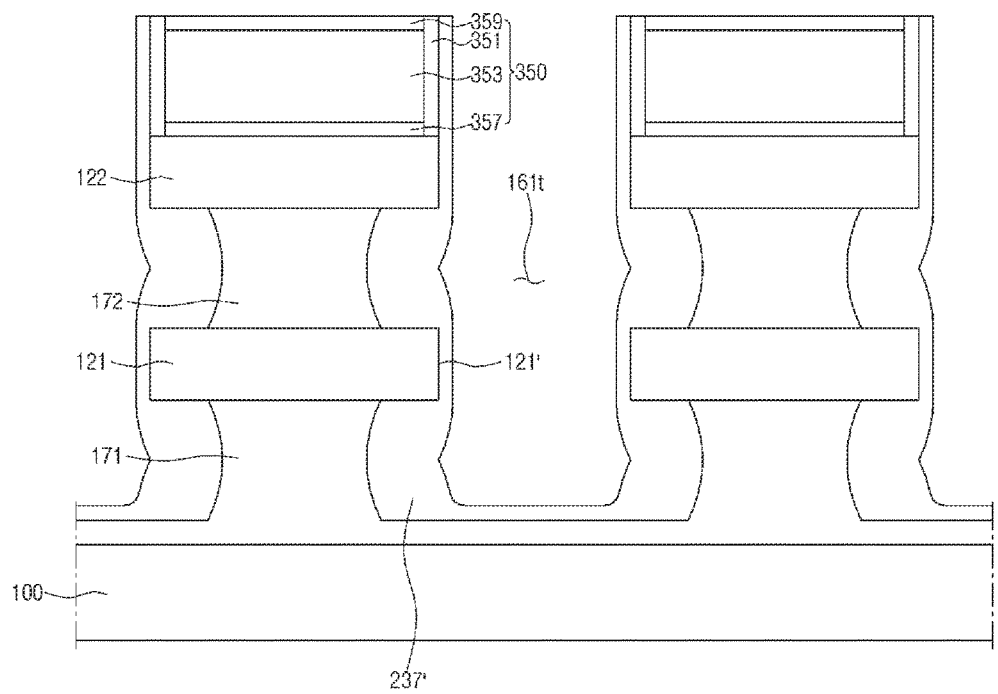

Referring to FIG. 29, a spacer layer 237' may be formed along the bottom of the trench 161t, filling the first and second recesses 335r and 435r. The spacer layer 237' may also be formed on the sidewall of the dummy gate spacer 351, the first wire pattern end 121' and an end of the second wire pattern 122. The spacer layer 237' is illustrated as not being formed on the top surface of the hard mask 359, but the present disclosure is not limited thereto. That is, the spacer layer 237' may be formed on the top surface of the hard mask 359, as necessary.

The spacer layer 237' may comprise the same material as the first spacer 135 and the second spacer 235.

Figure 30:
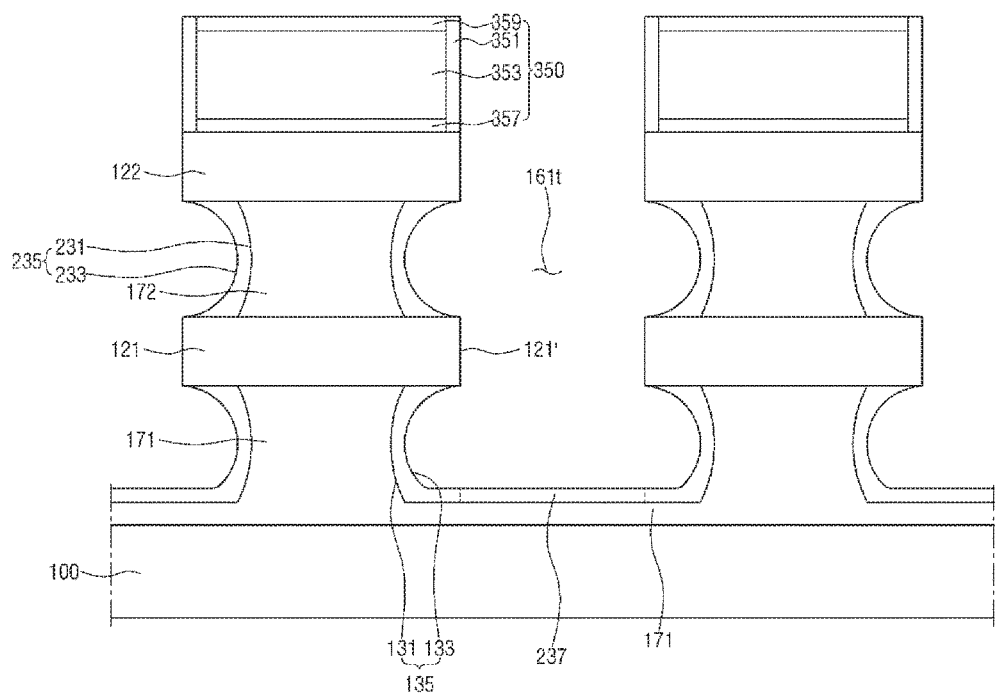
Figure 31:
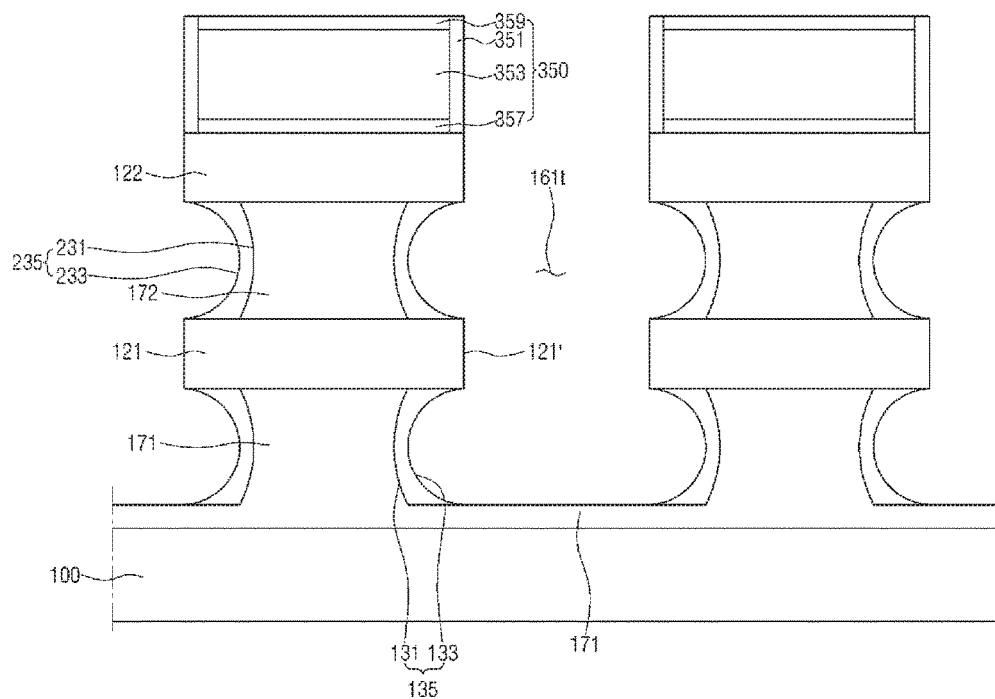

Referring to FIG. 30, the first spacer 135 may be formed by removing part of the spacer layer 237' that fills the first recess 335r. The second spacer 235 may be formed by removing part of the spacer layer 237' that fills the second recess 435r.

Parts of the spacer layer 237' that are formed on the first wire pattern end 121', the second wire pattern end, and on the sidewall of the dummy gate spacer 351 may also be removed.

In other words, the first spacer 135 may be formed along the sidewall and the bottom 335s of the first recess 335r, and may fill part of the first recess 335r. The second spacer 235 may be formed along the sidewall and the bottom 435s of the second recess 435r and may fill part of the second recess 435r.

The interface between the first spacer 135 and the first sacrificial pattern 171 may be curved. That is, the interface between the first spacer 135 and the first sacrificial pattern 171 may have an arbitrary curvature. For example, the interface between the first spacer 135 and the first sacrificial pattern 171 may be convex toward the first sacrificial pattern 171, but the present disclosure is not limited thereto. That is, the interface between the first spacer 135 and the first sacrificial pattern 171 may have a curvature close to zero.

The interface between the second spacer 235 and the second sacrificial pattern 172 may be curved. That is, for example, the interface between the second spacer 235 and the second sacrificial pattern 172 may have an arbitrary curvature. For example, the interface between the second spacer 235 and the second sacrificial pattern 172 may be convex toward the second sacrificial pattern 172, but the present disclosure is not limited thereto. That is, the interface between the second spacer 235 and the second sacrificial pattern 172 may have a curvature close to zero.

More specifically, as illustrated in FIG. 17B, the second spacer 235 may have the third and fourth sidewalls 231, 233, which extend from the second wire pattern 122 to the first wire pattern 121. In some example embodiments, the third and fourth sidewalls 231, 233 may be convex toward the gate electrode 140.

FIGS. 26 through 33 illustrate that the third and fourth sidewalls 231, 233 are both curved, but the present disclosure is not limited thereto. That is, as illustrated in FIGS. 21, 22 and 25, at least one of the third and fourth sidewalls 231, 233 may be curved.

Referring again to FIG. 31, a lower spacer pattern 237, which is part of the spacer layer 237' that is formed on the bottom of the trench 161t, may be removed. As a result of the removal of the lower spacer pattern 237, the top surface of part of the first sacrificial pattern 171 that is formed in an area that does not overlap the dummy gate structure 350 may be exposed by the trench 161t.

The lower spacer pattern 237, which is formed on the bottom of the trench 161t, may be removed by a process with directionality toward the top surface of the substrate 100. More specifically, the density of the lower spacer pattern 237 may be lowered by the process with directionality toward the top surface of the substrate 100, and the lower spacer pattern 237 with the lowered density may be removed by an etching process. For example, the process with directionality toward the top surface of the substrate 100 may be an Ion Implantation Process (IIP) or a process using plasma, but the present disclosure is not limited thereto.

In some example embodiments, the epitaxial growth of the semiconductor pattern 161 may be facilitated by removing the lower spacer pattern 237. More specifically, the semiconductor pattern 161 may not be able to be properly formed through epitaxial growth in the presence of the material of the first and second spacers 135, 235. Thus, any lower spacer pattern 237 that still remains on the bottom of the trench 161t needs to be removed. In some example embodiments, the lower spacer pattern 237 may be removed by performing a process with directionality toward the substrate 100, and as a result, subsequent processes such as the epitaxial growth of the semiconductor pattern 161 may be smoothly performed.

Figure 32:
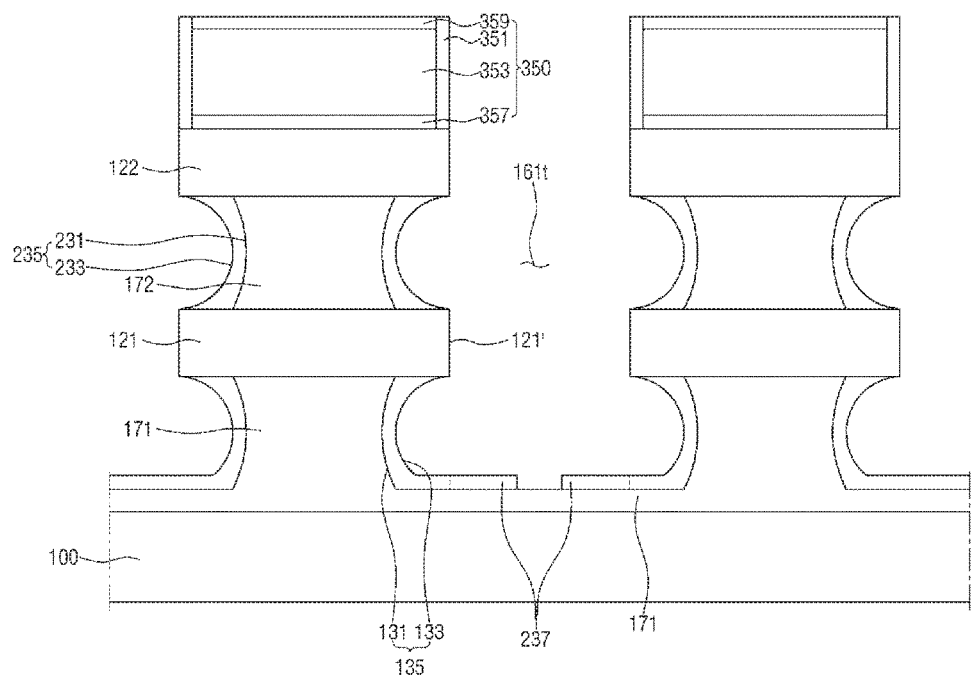

Referring to FIG. 32, in some example embodiments, part of the lower spacer pattern 237 may be removed, and the rest of the lower spacer pattern 237 may remain on the first sacrificial pattern 171. In response to the lower spacer pattern 237 being partially removed, the first sacrificial pattern 171 may be partially exposed.

In some example embodiments, even in a case in which only part of the lower spacer pattern 237 is removed, subsequent processes such as the epitaxial growth of the semiconductor pattern 161 may be smoothly performed due to the presence of the first sacrificial pattern 171 exposed by the lower spacer pattern 237.

Figure 33:
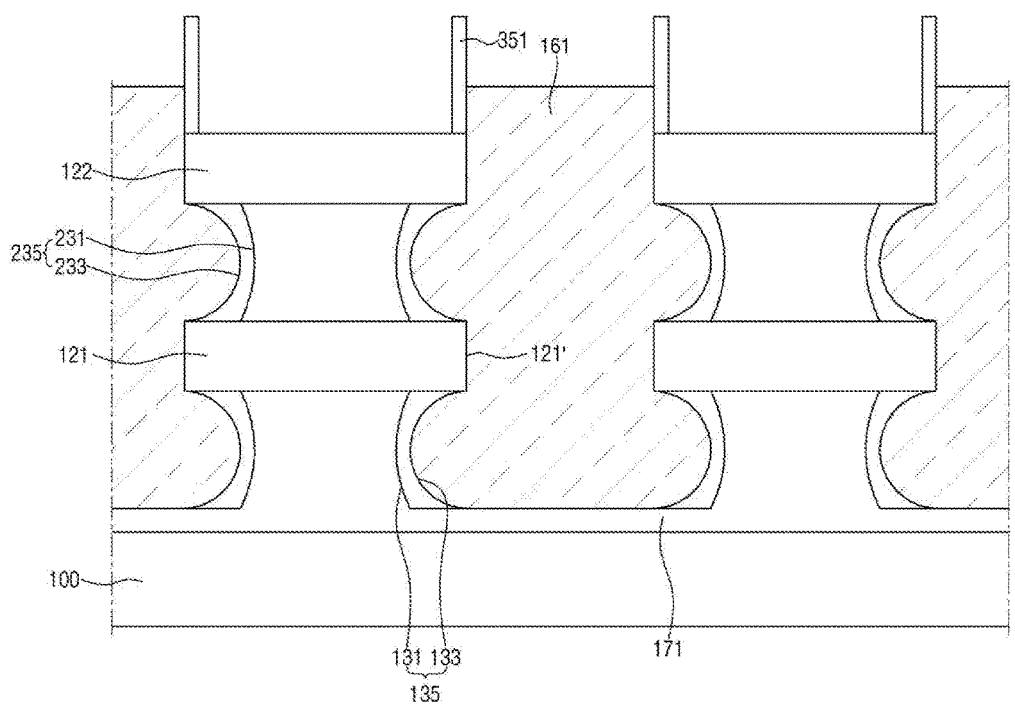

Referring to FIG. 33, the semiconductor pattern 161 may be formed to fill the trench 161t. For example, the semiconductor pattern 161 may be formed by epitaxial growth, but the present disclosure is not limited thereto. For example, the semiconductor pattern 161 may be formed by deposition.

The semiconductor pattern 161 may have portions that vertically overlap the first and second wire patterns 121, 122. In other words, part of the semiconductor pattern 161 may be formed to surround the first wire pattern end 121'.

In some example embodiments, by modifying the shape of the first and second spacers 135, 235, the semiconductor pattern 161 can be formed, through epitaxial growth, even on part of the first wire pattern 121 adjacent to the first wire pattern end 121'. Accordingly, the formation of an air gap on the sides of the first and second spacers 135 and 235 may be reduced.

The dummy gate structure 350 and the first and second sacrificial patterns 171, 172 may be removed, but the present disclosure is not limited thereto. That is, the dummy gate spacer 351 may remain as necessary.

Referring to FIGS. 17B, 21, 22 and 25, the gate insulating layer 157 and the gate electrode 140 may be formed in the area from which the dummy gate structure 350 and the first and second sacrificial patterns 171, 172 are removed.

A System-On-Chip (SoC) system comprising the semiconductor device according to some example embodiments will hereinafter be described with reference to FIG. 34. For clarity, descriptions of elements that have already been described above will be omitted.

Figure 34:
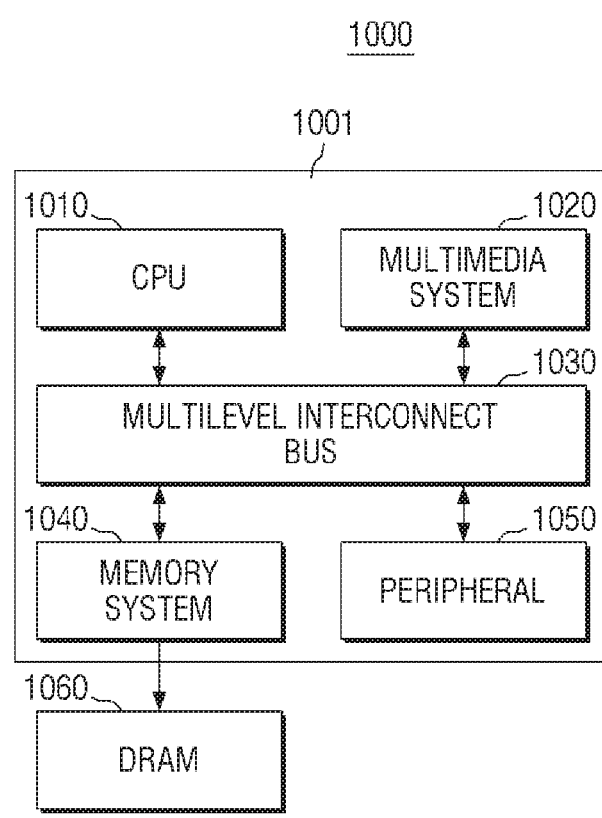
FIG. 34 is a block diagram of a System-on-Chip (SoC) system including a semiconductor device obtained by the method of FIGS. 26 through 33.

FIG. 34 is a block diagram of an SoC system comprising a semiconductor device obtained by the method of FIGS. 26 through 33.

Referring to FIG. 34, a SoC system 1000 includes an application processor 1001 and a Dynamic Random Access Memory (DRAM) 1060.

The application processor 1001 may include a central processing unit 1010, a multimedia system 1020, a bus 1030, a memory system 1040, and a peripheral circuit 1050.

The central processing unit 1010 may perform operations necessary for driving the SoC system 1000. In some example embodiments, the central processing unit 1010 may be provided as a multicore environment comprising a plurality of cores.

The multimedia system 1020 may be used to perform various multimedia functions in the SoC system 1000. The multimedia system 1020 may include a three-dimensional (3D) engine module, a video codec, a display system, a camera system, and a post-processor.

The bus 1030 may be used by the central processing unit 1010, the multimedia system 1020, the memory system 1040, and the peripheral circuit 1050 to communicate data with one another. In some example embodiments, the bus 1030 may have a multilayer structure. More specifically, a multilayer Advanced High-performance Bus (AHB) or a multilayer Advanced eXtensible Interface (AXI) may be used as the bus 1030, but the present disclosure is not limited thereto.

The memory system 1040 may provide an environment necessary for connecting the application processor 1001 to an external memory (for example, the DRAM 1060) and allowing the application processor 1001 to operate at high speed. In some example embodiments, the memory system 1040 may include an additional controller (for example, a DRAM controller) for controlling the external memory (for example, the DRAM 1060).

The peripheral circuit 1050 may provide an environment necessary for allowing the SoC system 1000 to properly access an external device (for example, a main board). Accordingly, the peripheral circuit 1050 may be equipped with various interfaces that allow the external device to be compatible with the SoC system 1000.

The DRAM 1060 may serve as an operating memory necessary for the operation of the application processor 1001. In some example embodiments, the DRAM 1060 may be disposed outside the application processor 1001. More specifically, the DRAM 1060 and the application processor 1001 may be packaged together in the form of a Package-on-Package (POP).

At least one of the elements of the SoC system 1000 may include the semiconductor device according to example embodiments.

While the inventive concepts has been particularly shown and described with reference to example embodiments thereof, it will be understood by those of ordinary skill in the art that various changes in form and details may be made therein without departing from the spirit and scope of the inventive concepts as defined by the following claims. It is therefore desired that the example embodiments be considered in all respects as illustrative and not restrictive, reference being made to the appended claims rather than the foregoing description to indicate the scope of inventive concepts.

What is claimed is:

1. A semiconductor device, comprising:
   a first wire pattern on a substrate, the first wire pattern isolated from the substrate;
   a gate electrode surrounding and intersecting the first wire pattern;
   a semiconductor pattern on at least two sides of the first wire pattern, the semiconductor pattern including a first part, the first part overlaps the first wire pattern;
   a gate insulating layer between the gate electrode and the first wire pattern, and the gate insulating layer surrounding the first wire pattern; and
   a first spacer between the first wire pattern and the substrate, and the first spacer between the gate insulating layer and the semiconductor pattern,
   wherein the first part of the semiconductor pattern is between the substrate and the first wire pattern.

2. The semiconductor device of claim 1, wherein the first spacer includes a side, the side is between the first spacer and the gate insulating layer, and the side is curved.

3. The semiconductor device of claim 2, wherein the side is convex with respect to the gate electrode.

4. The semiconductor device of claim 1, wherein the first spacer includes a side that faces the semiconductor pattern, and the side of the first spacer is curved.

5. The semiconductor device of claim 4, wherein the side of the first spacer is convex with respect to the gate electrode.

6. The semiconductor device of claim 1, wherein,
   the first spacer includes a first thickness and a second thickness, a first location of the first spacer having the first thickness, and a second location of the first spacer having the second thickness, the first thickness is different from the second thickness; and
   the first location is a first distance from an end of the first wire pattern, and the second location is a second distance from the end of the first wire pattern, the second distance is greater than the first distance.

7. The semiconductor device of claim 1, further comprising:
   a plurality of lower spacer patterns, the plurality of lower spacer patterns including a first lower spacer pattern and a second lower spacer pattern, the first and second lower spacer patterns between the substrate and the semiconductor pattern, the first lower spacer pattern and the second lower space pattern spaced apart from each other.

8. The semiconductor device of claim 1, further comprising:
   a first sacrificial pattern between the substrate and the semiconductor pattern, the semiconductor pattern contacts the first sacrificial pattern.

9. The semiconductor device of claim 1, further comprising:
   a second wire pattern on the first wire pattern, the second wire pattern isolated from the first wire pattern,
   wherein,
      the gate electrode surrounds the second wire pattern,
      the semiconductor pattern is on at least two sides of the second wire pattern,
      the gate insulating layer is between the gate electrode and the second wire pattern, and the gate insulating layer surrounds the second wire pattern, and
      the semiconductor pattern includes a second part, the second part overlaps the second wire pattern.

10. The semiconductor device of claim 9, further comprising:
    a second spacer between the second wire pattern and the first wire pattern, and the second spacer between the gate insulating layer and the semiconductor pattern.

11. The semiconductor device of claim 1, wherein the semiconductor pattern is a source/drain region.

12. A semiconductor device, comprising:
    a first wire pattern on a substrate, the first wire pattern isolated from the substrate;

a gate electrode surrounding and intersecting the first wire pattern;

a semiconductor pattern on at least two adjacent sides of the first wire pattern;

a gate insulating layer between the gate electrode and the first wire pattern, and the gate insulating layer surrounding the first wire pattern; and a first spacer between the first wire pattern and the substrate, the first spacer between the gate insulating layer and the semiconductor pattern, and the first spacer including first and second sidewalls, the first and second sidewalls extend from the first wire pattern toward the substrate, wherein at least one of the first and second sidewalls is convex toward the gate electrode.

13. The semiconductor device of claim 12, wherein a part of the semiconductor pattern overlaps the first wire pattern.

14. The semiconductor device of claim 12, wherein, the first spacer includes a first thickness and a second thickness, a first location of the first spacer having the first thickness, and a second location of the first spacer having the second thickness, the first thickness is different from the second thickness; and the first location is a first distance from an end of the first wire pattern, and the second location is a second distance from the end of the first wire pattern, the second distance is greater than the first distance.

15. A semiconductor device, comprising:

a wire pattern on a substrate, the wire pattern isolated from the substrate and wherein the wire pattern extends in a first direction, comprises first and second sides that are adjacent to each other, the first side of the wire pattern is perpendicular to an upper surface of the substrate and the second side of the wire pattern extends in the first direction;

a gate electrode surrounding and intersecting the wire pattern;

a semiconductor pattern on the first and second sides of the wire pattern;

a gate insulating layer between the gate electrode and the wire pattern; and a spacer on the second side of the wire pattern, the spacer between the semiconductor pattern and the gate insulating layer.

16. The semiconductor device of claim 15, wherein the spacer is convex with respect to the gate insulating layer.

17. The semiconductor device of claim 15, wherein the spacer includes a first thickness and a second thickness, the first thickness is different from the second thickness.

18. The semiconductor device of claim 17, wherein a first location of the spacer has the first thickness, the first location corresponds to a point of contact between the first side of the spacer and the wire pattern, the first thickness is less than the second thickness.

19. The semiconductor device of claim 18, wherein a second location of the spacer has the second thickness, the second location corresponds to a point of contact between the second side of the spacer and the gate insulating layer.

20. The semiconductor device of claim 15, wherein the semiconductor pattern is a source/drain region.

* * * * *